United States Patent
Ishitani et al.

(10) Patent No.: US 7,804,244 B2
(45) Date of Patent: Sep. 28, 2010

(54) DISPLAY DEVICE

(75) Inventors: Tetsuji Ishitani, Kanagawa (JP); Yuji Egi, Kanagawa (JP); Takeshi Nishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 400 days.

(21) Appl. No.: 11/563,428

(22) Filed: Nov. 27, 2006

(65) Prior Publication Data

US 2007/0120475 A1 May 31, 2007

(30) Foreign Application Priority Data

Nov. 30, 2005 (JP) .............................. 2005-345537

(51) Int. Cl.
*H01L 51/52* (2006.01)
(52) U.S. Cl. .................... 313/506; 349/122; 427/163.1
(58) Field of Classification Search ......... 313/498–512; 350/397; 349/117, 122; 427/163.1
See application file for complete search history.

(56) References Cited

U.S. PATENT DOCUMENTS

| | | | |
|---|---|---|---|
| 4,068,926 A | 1/1978 | Nakamura et al. | |
| 4,592,623 A | 6/1986 | Yamamoto et al. | |
| 4,968,120 A | 11/1990 | Depp et al. | |
| 5,142,393 A | 8/1992 | Okumura et al. | |
| 5,305,143 A | 4/1994 | Taga et al. | |
| 5,519,523 A * | 5/1996 | Madokoro et al. | .......... 349/117 |
| 5,583,677 A | 12/1996 | Ito et al. | |
| 5,805,253 A | 9/1998 | Mori et al. | |
| 5,831,375 A * | 11/1998 | Benson, Jr. | .................. 313/110 |
| 6,023,317 A | 2/2000 | Xu et al. | |
| 6,147,734 A | 11/2000 | Kashima | |
| 6,201,592 B1 | 3/2001 | Terashita et al. | |
| 6,577,361 B1 | 6/2003 | Sekiguchi et al. | |
| 6,646,698 B2 | 11/2003 | Mori | |
| 6,706,339 B1 | 3/2004 | Miyatake et al. | |
| 6,765,721 B2 | 7/2004 | Kawazu et al. | |
| 6,806,640 B2 | 10/2004 | Okada et al. | |
| 6,816,217 B2 | 11/2004 | Sone | |
| 6,897,914 B2 | 5/2005 | Yoshida | |

(Continued)

FOREIGN PATENT DOCUMENTS

EP          0 365 778          5/1990

(Continued)

OTHER PUBLICATIONS

International Search Report (Application No. PCT/JP2006/323515), dated Dec. 26, 2006.

(Continued)

*Primary Examiner*—Nimeshkumar D Patel
*Assistant Examiner*—Mary Ellen Bowman
(74) *Attorney, Agent, or Firm*—Fish & Richardson P.C.

(57) ABSTRACT

It is an object to provide a display device having an electroluminescent element in which a contrast ratio is increased. In a display device having an electroluminescent element between a pair of light transmitting substrates, a circularly polarizing plate having stacked polarizing plates arranged on outer sides thereof is provided. At this time, opposed polarizing plates are arranged to be in a crossed nicol state or in a parallel nicol state. As a result, a display device with a high contrast ratio can be provided.

21 Claims, 20 Drawing Sheets

U.S. PATENT DOCUMENTS

| | | |
|---|---|---|
| 6,897,916 B2 | 5/2005 | Hamamoto |
| 6,934,081 B2 | 8/2005 | Higashio et al. |
| 6,970,218 B2 | 11/2005 | Fukuda et al. |
| 6,985,291 B2 | 1/2006 | Watson et al. |
| 6,998,772 B2 | 2/2006 | Terumoto |
| 7,015,990 B2 | 3/2006 | Yeh et al. |
| 7,034,451 B2 | 4/2006 | Senbonmatsu |
| 7,057,682 B2 | 6/2006 | Watson et al. |
| 7,059,718 B2 | 6/2006 | Masterson |
| 7,126,659 B2 | 10/2006 | Fukuda et al. |
| 7,144,608 B2 | 12/2006 | Paukshto et al. |
| 7,157,156 B2 | 1/2007 | Raychaudhuri et al. |
| 7,161,185 B2 | 1/2007 | Yamazaki et al. |
| 7,161,649 B2 | 1/2007 | Lee et al. |
| 7,175,898 B2 | 2/2007 | Lühmann et al. |
| 7,176,619 B2 | 2/2007 | Miyachi et al. |
| 7,176,999 B2 | 2/2007 | Miyachi |
| 7,301,591 B2 | 11/2007 | Akiyama |
| 7,307,679 B2 | 12/2007 | Toyooka et al. |
| 7,315,338 B2 | 1/2008 | Yeh et al. |
| 7,317,279 B2 | 1/2008 | Chen |
| 7,324,180 B2 | 1/2008 | Kashima |
| 7,339,316 B2 | 3/2008 | Adachi et al. |
| 7,375,464 B2 | 5/2008 | Chin et al. |
| 7,453,640 B2 | 11/2008 | Yeh et al. |
| 7,468,769 B2 | 12/2008 | Nakagawa |
| 7,688,403 B2 | 3/2010 | Usukura et al. |
| 2002/0093284 A1 | 7/2002 | Adachi et al. |
| 2002/0159003 A1 | 10/2002 | Sato et al. |
| 2004/0201795 A1 | 10/2004 | Paukshto |
| 2004/0227698 A1 | 11/2004 | Yamazaki et al. |
| 2004/0239658 A1 | 12/2004 | Koyama et al. |
| 2004/0245529 A1 | 12/2004 | Yamazaki et al. |
| 2004/0251823 A1* | 12/2004 | Park et al. .................. 313/506 |
| 2004/0257497 A1 | 12/2004 | Paukshto et al. |
| 2004/0263056 A1 | 12/2004 | Seo et al. |
| 2004/0263066 A1 | 12/2004 | Abe et al. |
| 2004/0263069 A1 | 12/2004 | Yamazaki et al. |
| 2005/0024339 A1 | 2/2005 | Yamazaki et al. |
| 2005/0127820 A1 | 6/2005 | Yamazaki et al. |
| 2006/0055847 A1 | 3/2006 | Yamazaki et al. |
| 2006/0114384 A1 | 6/2006 | Yeh et al. |
| 2006/0164571 A1 | 7/2006 | Broer et al. |
| 2006/0215096 A1 | 9/2006 | Iwamoto et al. |
| 2007/0014009 A1 | 1/2007 | Cross et al. |
| 2007/0121033 A1 | 5/2007 | Ishitani et al. |
| 2007/0126962 A1 | 6/2007 | Egi et al. |
| 2007/0146579 A1 | 6/2007 | Egi et al. |
| 2007/0146580 A1 | 6/2007 | Ishitani et al. |
| 2007/0159044 A1 | 7/2007 | Ishitani et al. |
| 2007/0177071 A1 | 8/2007 | Egi et al. |
| 2007/0177084 A1 | 8/2007 | Ishitani et al. |
| 2007/0177086 A1 | 8/2007 | Ishitani et al. |
| 2007/0182885 A1 | 8/2007 | Egi et al. |
| 2007/0200977 A1 | 8/2007 | Egi et al. |
| 2007/0200978 A1 | 8/2007 | Ishitani et al. |

FOREIGN PATENT DOCUMENTS

| | | |
|---|---|---|
| EP | 1 152 282 | 11/2001 |
| EP | 1 478 033 | 11/2004 |
| JP | 62-206524 | 9/1987 |
| JP | 64-082014 | 3/1989 |
| JP | 03-257429 | 11/1991 |
| JP | 05-034731 | 2/1993 |
| JP | 05-100114 | 4/1993 |
| JP | 06-222357 | 8/1994 |
| JP | 07-142170 | 6/1995 |
| JP | 07-181476 | 7/1995 |
| JP | 2761453 | 6/1998 |
| JP | 10-255976 | 9/1998 |
| JP | 2000-180843 | 6/2000 |
| JP | 2000-249832 | 9/2000 |
| JP | 3174367 | 6/2001 |
| JP | 2001-242320 | 9/2001 |
| JP | 2002-277867 | 9/2002 |
| JP | 2003-172819 | 6/2003 |
| JP | 2003-279963 | 10/2003 |
| JP | 2004-354818 | 12/2004 |
| JP | 3594868 | 12/2004 |
| JP | 2005-038608 | 2/2005 |
| WO | WO00/34821 | 6/2000 |
| WO | WO 2004/036272 | 4/2004 |

OTHER PUBLICATIONS

Written Opinion (Application No. PCT/JP2006/323515), dated Dec. 26, 2006.

P. Lazarev et al,: "Thin Crystal Films (TCF) for LCD Contrast Enhancement" SID Digest '03 : SID International Symposium Digest of Technical Papers, pp. 669-671 (2003).

J. Chen et al.: "Optimum Film Compensation Modes for TN and VA LCDs" SID Digest '98 : SID International Symposium Digest of Technical Papers, pp. 315-318 (1998).

* cited by examiner

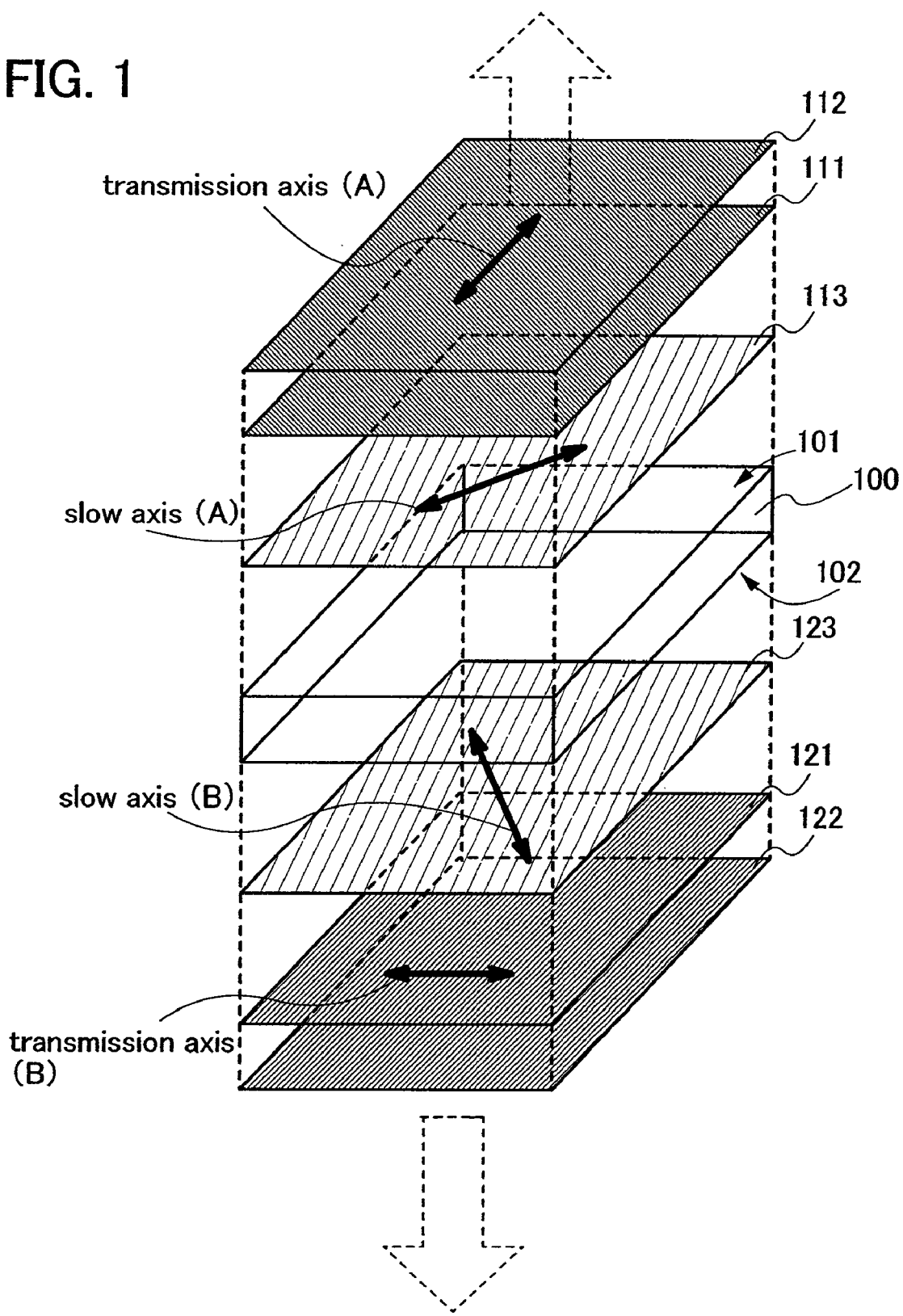

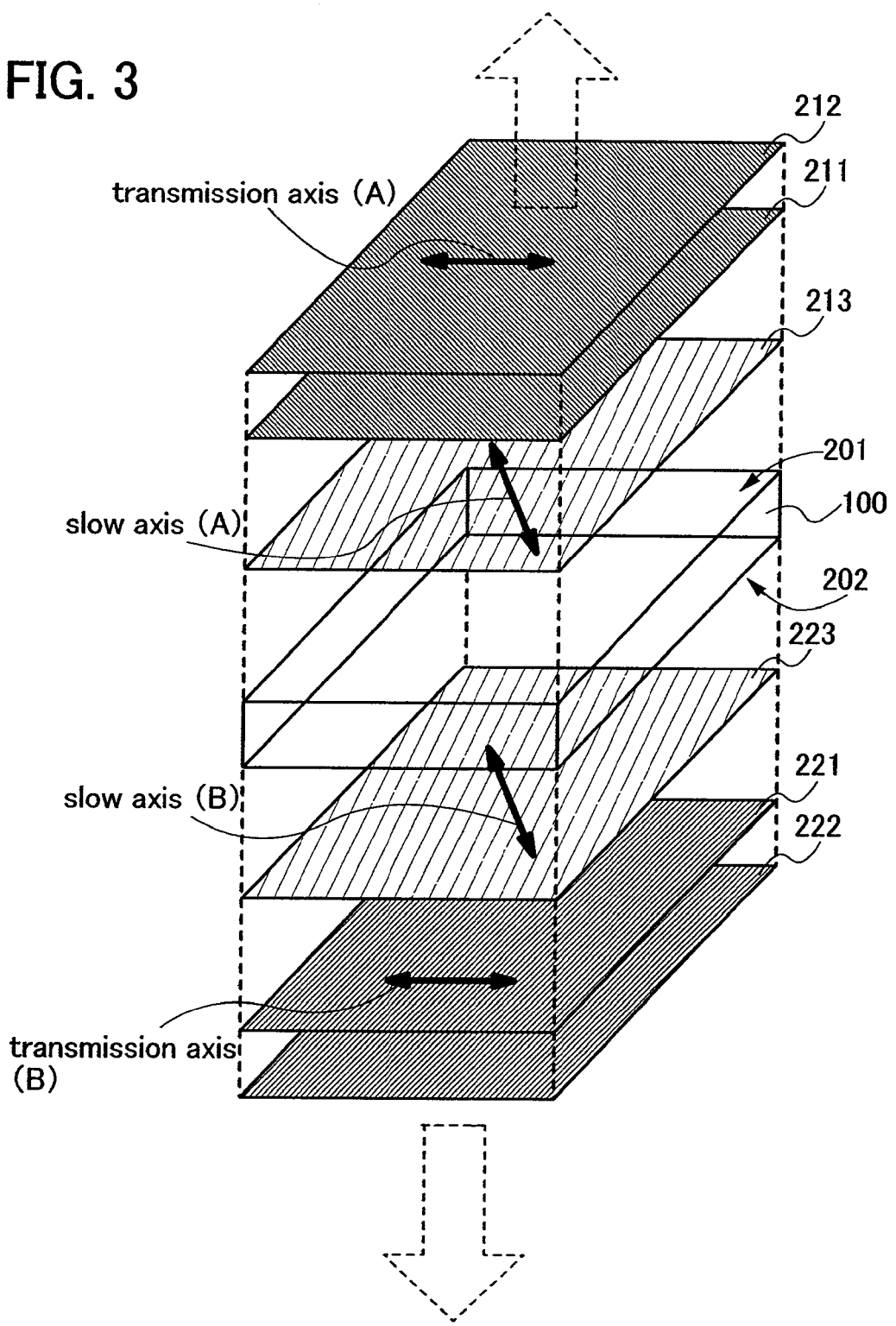

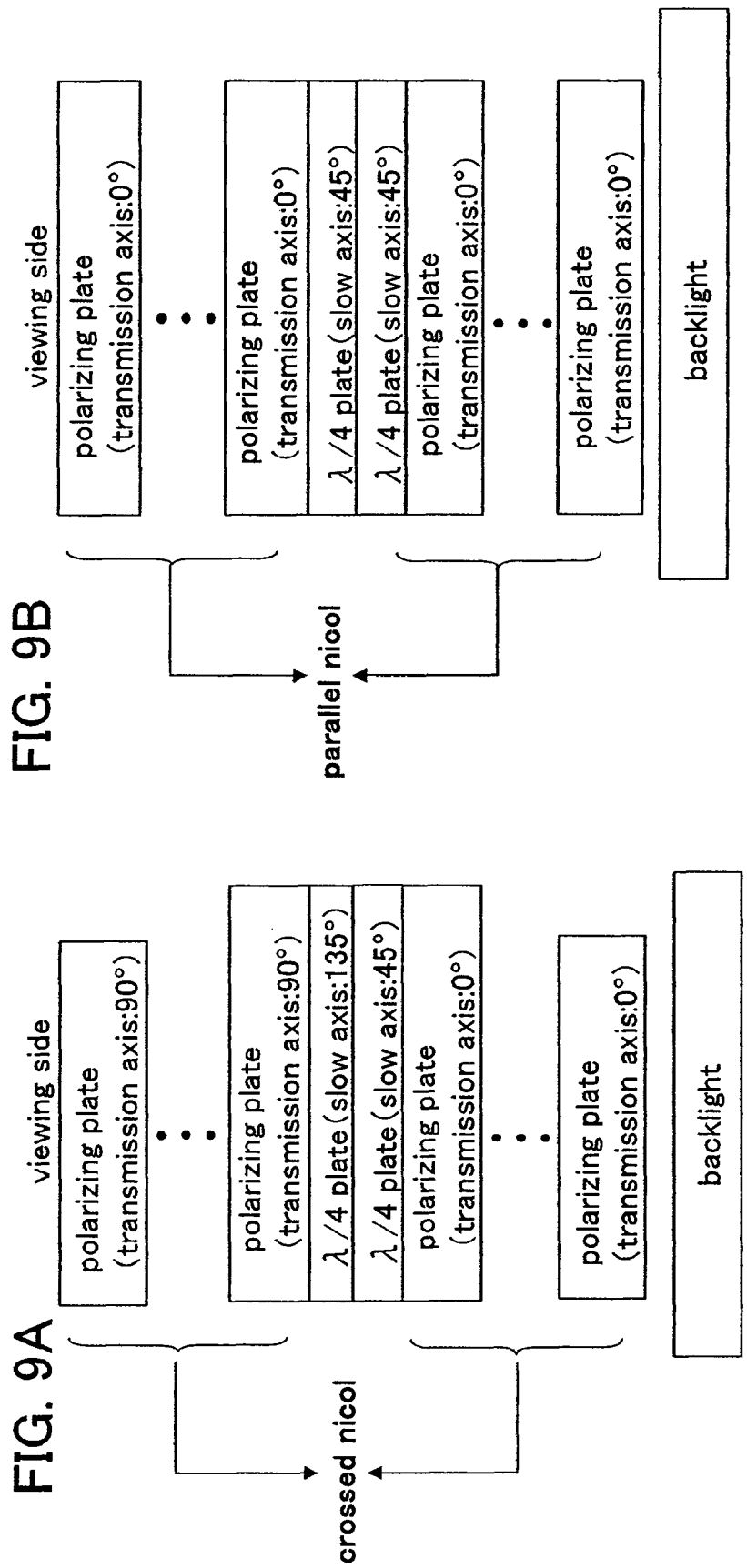

DISPLAY DEVICE

TECHNICAL FIELD

The present invention relates to a structure of a display device for increasing a contrast ratio.

BACKGROUND ART

A display device which is much thinner and lighter than a conventional cathode-ray tube, namely a flat panel display has been developed. A liquid crystal display device having a liquid crystal element as a display element, a display device having a self-light emitting element, an FED (a field emission display) utilizing an electron source, and the like are competing against each other as a flat panel display, and are desired to consume low power and have a high contrast ratio to be differentiated from other products by adding a high value.

In a general liquid crystal display device, each substrate is provided with one polarizing plate, whereby a contrast ratio is kept. As a contrast ratio becomes high, clearer black display can be performed, whereby a high display quality can be provided in a case where a picture is seen in a dark room like a home theater.

For example, a structure is proposed, in which a third polarizing plate is provided in a case where a first polarizing plate is provided on an outer side of a substrate on a viewing side of a liquid crystal cell, a second polarizing plate is provided on an outer side of a substrate opposite to the viewing side, and light from an auxiliary light source provided on the substrate side is polarized through the second polarizing plate to pass the liquid crystal cell, in order to increase a contrast ratio (refer to Patent Document 1: PCT International Publication No. 00/34821).

As a flat panel display like a liquid crystal display device, there is a display device having an electroluminescent element. The electroluminescent element is a self-light emitting element and no light irradiation means such as a backlight is required, whereby thinning of a display device can be attempted. Further, a display device having an electroluminescent element has an advantage that response speed is higher and dependence on a viewing angle is less than a liquid crystal display device.

A structure is also proposed, in which a polarizing plate or a circularly polarizing plate are provided, with respect to a display device having an electroluminescent element (Patent Document 2: Japanese Patent No. 2761453 and Patent Document 3: Japanese Patent No. 3174367).

As a structure of a display device having an electroluminescent element, a structure is proposed, in which light emitted from a light emitting element interposed between light transmitting substrates can be observed as light on an anode substrate side and light on a cathode substrate side (Japanese Published Patent Application No. H10-255976).

DISCLOSURE OF INVENTION

However, request to make a contrast ratio high is desired for not only a liquid crystal display device but also a display device having an electroluminescent element.

In view of the foregoing problem, one feature of the present invention is that light transmitting substrates arranged to be opposed to each other, are each provided with a circularly polarizing plate having a plurality of polarizing plates. The plurality of polarizing plates can be polarizing plates having a stacked structure. Since the circularly polarizing plate has a structure including a polarizing plate and a retardation film, another feature of the present invention is that a retardation film and a plurality of polarizing plates are sequentially arranged over respective light transmitting substrates arranged to be opposed to each other.

The opposed polarizing plates are arranged to be in a crossed nicol state or a parallel nicol state. "Crossed nicol state" refers to arrangement in which transmission axes of the polarizing plates are shifted from each other by 90°. "Parallel nicol state" refers to arrangement in which transmission axes of the polarizing plates are shifted from each other by 0°. An absorption axis is provided to be orthogonal to the transmission axis of the polarizing plate, and "crossed nicol state" and "parallel nicol state" are also defined using the absorption axis in the same manner. Stacked polarizing plates are arranged to be in a parallel nicol state.

The polarizing plate and the retardation film provided on one substrate side are arranged to be shifted from each other by 45°. Specifically, slow axes of the retardation film is arranged to be at 45° or 135° when the transmission axis of the polarizing plate is at 90°.

One feature of the present invention is a display device including a light emitting element which is provided between a first light transmitting substrate and a second light transmitting substrate arranged to be opposed to each other, and emits light in both directions of the first light transmitting substrate and the second light transmitting substrate; a first circularly polarizing plate having stacked first linearly polarizing plates, which is arranged on an outer side of the first light transmitting substrate; and a second circularly polarizing plate having stacked second linearly polarizing plates, which is arranged on an outer side of the second light transmitting substrate.

One feature of the present invention is a display device including a light emitting element which is provided between a first light transmitting substrate and a second light transmitting substrate arranged to be opposed to each other, and emits light in both directions of the first light transmitting substrate and the second light transmitting substrate; a first circularly polarizing plate having stacked first linearly polarizing plates, which is arranged on an outer side of the first light transmitting substrate; and a second circularly polarizing plate having stacked second linearly polarizing plates, which is arranged on an outer side of the second light transmitting substrate, where transmission axes of the stacked first linearly polarizing plates are arranged to be in a parallel nicol state, transmission axes of the stacked second linearly polarizing plates are arranged to be in a parallel nicol state, and the transmission axes of the stacked first linearly polarizing plates and the transmission axes of the stacked second linearly polarizing plates are arranged to be in a parallel nicol state.

One feature of the present invention is a display device including a light emitting element which is provided between a first light transmitting substrate and a second light transmitting substrate arranged to be opposed to each other, and emits light in both directions of the first light transmitting substrate and the second light transmitting substrate; stacked first linearly polarizing plates which are arranged on an outer side of the first light transmitting substrate; stacked second linearly polarizing plates which are arranged on an outer side of the second light transmitting substrate; a first retardation film provided between the first light transmitting substrate and the first linearly polarizing plate; and a second retardation film provided between the second light transmitting substrate and the second linearly polarizing plate, where transmission axes of the stacked first linearly polarizing plates are arranged to be in a parallel nicol state, transmission axes of the stacked second linearly polarizing plates are arranged to be in a parallel nicol state, the transmission axes of the stacked first linearly polarizing plates and the transmission axes of the stacked second linearly polarizing plates are arranged to be in a parallel nicol state, a slow axis of the first retardation film is arranged to be at 45° with respect to the transmission axis of the first linearly polarizing plate, and a slow axis of the second retardation film is arranged to be at 45° with respect to the transmission axis of the second linearly polarizing plate.

One feature of the present invention is a display device including a light emitting element which is provided between a first light transmitting substrate and a second light transmitting substrate arranged to be opposed to each other, and emits light in both directions of the first light transmitting substrate and the second light transmitting substrate; stacked first linearly polarizing plates which are arranged on an outer side of the first light transmitting substrate; a second linearly polarizing plate which is arranged on an outer side of the second light transmitting substrate; a first retardation film provided between the first light transmitting substrate and the first linearly polarizing plate; and a second retardation film provided between the second light transmitting substrate and the second linearly polarizing plate, where transmission axes of the stacked first linearly polarizing plates are arranged to be in a parallel nicol state, the transmission axes of the stacked first linearly polarizing plates and a transmission axis of the second linearly polarizing plate are arranged to be in a parallel nicol state, a slow axis of the first retardation film is arranged to be at 45° with respect to the transmission axis of the first linearly polarizing plate, and a slow axis of the second retardation film is arranged to be at 45° with respect to the transmission axis of the second linearly polarizing plate.

One feature of the present invention is a display device including a light emitting element which is provided between a first light transmitting substrate and a second light transmitting substrate arranged to be opposed to each other, and emits light in both directions of the first light transmitting substrate and the second light transmitting substrate; a first circularly polarizing plate having stacked first linearly polarizing plates which is arranged on an outer side of the first light transmitting substrate; and a second circularly polarizing plate having stacked second linearly polarizing plates which is arranged on an outer side of the second light transmitting substrate, where transmission axes of the stacked first linearly polarizing plates are arranged to be in a parallel nicol state, transmission axes of the stacked second linearly polarizing plates are arranged to be in a parallel nicol state, and the transmission axes of the stacked first linearly polarizing plates and the transmission axes of the stacked second linearly polarizing plates are arranged to be in a crossed nicol state.

One feature of the present invention is a display device including a light emitting element which is provided between a first light transmitting substrate and a second light transmitting substrate arranged to be opposed to each other, and emits light in both directions of the first light transmitting substrate and the second light transmitting substrate; stacked first linearly polarizing plates which are arranged on an outer side of the first light transmitting substrate; stacked second linearly polarizing plates which are arranged on an outer side of the second light transmitting substrate; a first retardation film provided between the first light transmitting substrate and the first linearly polarizing plate; and a second retardation film provided between the second light transmitting substrate and the second linearly polarizing plate, where transmission axes of the stacked first linearly polarizing plates are arranged to be in a parallel nicol state, transmission axes of the stacked second linearly polarizing plates are arranged to be in a parallel nicol state, the transmission axes of the stacked first linearly polarizing plates and the transmission axes of the stacked second linearly polarizing plates are arranged to be in a crossed nicol state, a slow axis of the first retardation film is arranged to be at 45° with respect to the transmission axis of the first linearly polarizing plate, and a slow axis of the second retardation film is arranged to be at 45° with respect to the transmission axis of the second linearly polarizing plate.

One feature of the present invention is a display device including a light emitting element which is provided between a first light transmitting substrate and a second light transmitting substrate arranged to be opposed to each other, and emits light in both directions of the first light transmitting substrate and the second light transmitting substrate; stacked first linearly polarizing plates which are arranged on an outer side of the first light transmitting substrate; a second linearly polarizing plate which is arranged on an outer side of the second light transmitting substrate; a first retardation film provided between the first light transmitting substrate and the first linearly polarizing plate; and a second retardation film provided between the second light transmitting substrate and the second linearly polarizing plate, where transmission axes of the stacked first linearly polarizing plates are arranged to be in a parallel nicol state, the transmission axes of the stacked first linearly polarizing plates and a transmission axis of the second linearly polarizing plate are arranged to be in a crossed nicol state. A slow axis of the first retardation film is arranged to be at 45° with respect to the transmission axis of the first linearly polarizing plate, and a slow axis of the second retardation film is arranged to be at 45° with respect to the transmission axis of the second linearly polarizing plate.

In the present invention, a display element is a light emitting element. An element utilizing electroluminescence (an electroluminescent element), an element utilizing plasma, and an element utilizing field emission are given as the light emitting element. The electroluminescent element can be divided into an organic EL element and an inorganic EL element depending on a material to be applied. A display device having such a light emitting element is also referred to as a light emitting device.

By employing a simple structure in which a plurality of polarizing plates are provided, a contrast ratio of a display device having a light emitting element can be increased.

BRIEF DESCRIPTION OF DRAWINGS

In the accompanying drawings:

FIG. 1 is a view showing a display device of the present invention;

FIG. 3 is a view showing a display device of the present invention;

FIGS. 9A and 9B are views each showing a measurement system of black transmittance of Embodiment 1;

BEST MODE FOR CARRYING OUT THE INVENTION

Figure 2A:
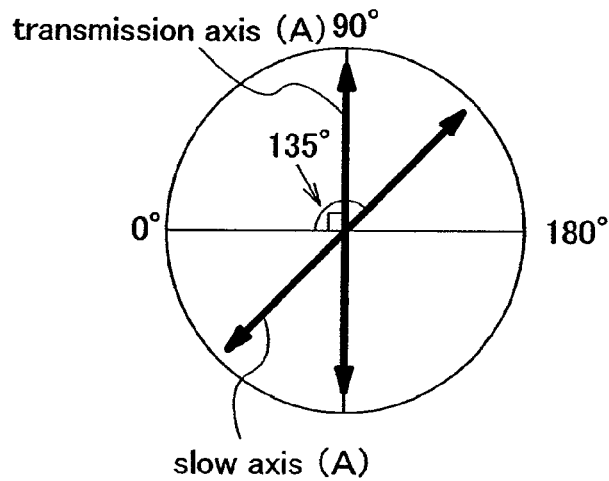
FIGS. 2A to 2C are views each showing an optical axis of the present invention.

Embodiment modes according to the present invention are described in detail with reference to the drawings. However, it is easily understood by those skilled in the art that embodiment modes and details herein disclosed can be modified in various ways without departing from the purpose and the scope of the present invention. Therefore, it should be noted that the description of embodiment modes to be given below should not be interpreted as limiting the present invention. In addition, in all figures for describing the embodiment modes, the same reference numerals denote the same parts or parts having the same function and the explanation will not be repeated.

Embodiment Mode 1

In this embodiment mode, a concept of a display device of the present invention will be explained. In this embodiment mode, explanation will be made using an electroluminescent element as a light emitting element.

As shown in FIG. 1, a layer 100 having an electroluminescent element is interposed between a first light transmitting substrate 101 and a second light transmitting substrate 102 arranged to be opposed to each other. Light from the electroluminescent element can be emitted to the first light transmitting substrate 101 side and the second light transmitting substrate 102 side (directions indicated by dotted arrows). As the light transmitting substrate, for example, a glass substrate such as a barium borosilicate glass or an alumino borosilicate glass, a quartz substrate, or the like can be used. Further, a substrate formed from a synthetic resin having flexibility such as plastic represented by polyethylene-terephthalate (PET), polyethylene naphthalate (PEN), and polyethersulfone (PES), or acrylic can be applied.

A retardation film and stacked polarizing plates are provided on outer sides of the first light transmitting substrate 101 and the second light transmitting substrate 102, namely sides which are not in contact with the layer 100 having an electroluminescent element. Light is linearly polarized by the polarizing plate and circularly polarized by the retardation film. That is, the stacked polarizing plates can be referred to as stacked linearly polarizing plates. The stacked polarizing plates refer to a state where two or more polarizing plates are stacked.

A retardation film (A) 113, a first polarizing plate (A) 111, and a second polarizing plate (A) 112 are sequentially provided on the outer side of the first light transmitting substrate 101. The retardation film, which is a λ/4 plate in this case, and the stacked polarizing plates are also collectively referred to as a circularly polarizing plate having stacked polarizing plates (linearly polarizing plates). A transmission axis (A) of the first polarizing plate (A) 111 and a transmission axis (A) of the second polarizing plate (A) 112 are arranged to be parallel to each other. In other words, the first polarizing plate (A) 111 and the second polarizing plate (A) 112, namely stacked polarizing plates (A) are arranged to be in a parallel nicol state. A slow axis (A) of the retardation film (A) 113 is arranged to be shifted from the transmission axis (A) of the first polarizing plate (A) 111 and the transmission axis (A) of the second polarizing plate (A) 112 by 45°.

FIG. 2A shows an angular deviation of the transmission axis (A) and the slow axis (A). The slow axis (A) is at 135° and the transmission axis (A) is at 90°, which means they are shifted from each other by 45°.

A retardation film (B) 123, a first polarizing plate (B) 121, and a second polarizing plate (B) 122 are sequentially provided on the outer side of the second light transmitting substrate 102. The retardation film and the stacked polarizing plates are also collectively referred to as a circularly polarizing plate having stacked polarizing plates. A transmission axis (B) of the first polarizing plate (B) 121 and a transmission axis (B) of the second polarizing plate (B) 122 are arranged to be parallel to each other. In other words, the first polarizing plate (B) 121 and the second polarizing plate (B) 122, namely stacked polarizing plates (B) are arranged to be in a parallel nicol state. A slow axis (B) of the retardation film (B) 123 is arranged to be shifted from the transmission axis (B) of the first polarizing plate (B) 121 and the transmission axis (B) of the second polarizing plate (B) 122 by 45°.

Figure 2B:
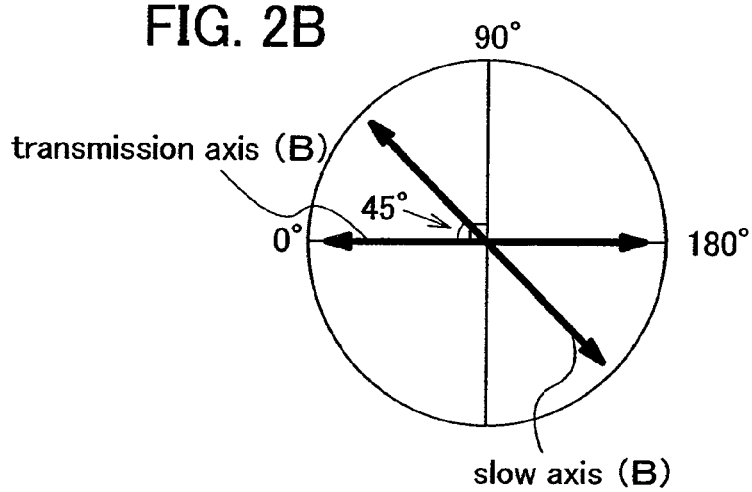

FIG. 2B shows an angular deviation of the transmission axis (B) and the slow axis (B). The slow axis (B) is at 45° and the transmission axis (B) is at 0°, which means they are shifted from each other by 45°. In other words, a slow axis of the retardation film (A) is arranged to be at 45° with respect to transmission axes of stacked polarizing plates (A), namely shifted from the transmission axes of the stacked polarizing plates (A) by 45°, and the slow axis of the retardation film (B) is arranged to be at 45° with respect to the transmission axes of stacked polarizing plates (B), namely shifted from the transmission axes of stacked polarizing plates (B) by 45°.

One feature of the present invention is that the transmission axes (A) of stacked polarizing plates (A) provided for the first light transmitting substrate 101 and the transmission axes (B) of stacked polarizing plates (B) provided for the second light transmitting substrate 102 are orthogonal to each other. In other words, stacked polarizing plates (A) and stacked polarizing plates (B), namely opposed polarizing plates, are arranged to be in a crossed nicol state.

Figure 2C:
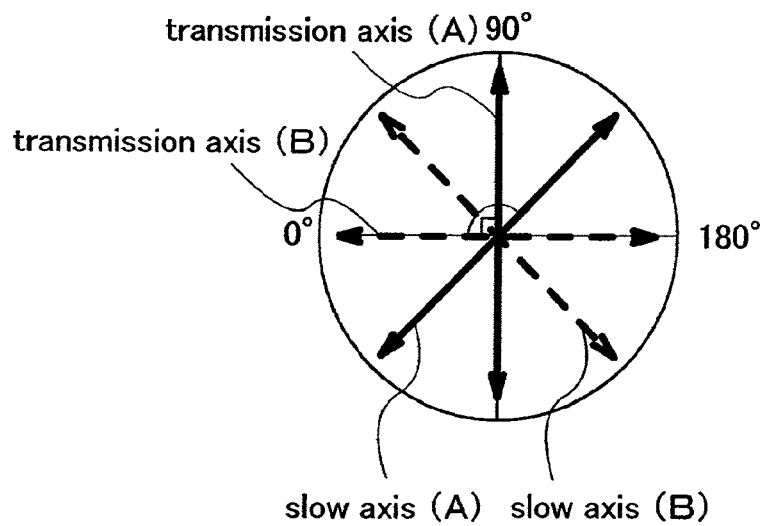

FIG. 2C shows a state where the transmission axis (A) and the slow axis (A) each indicated by a solid line and the transmission axis (B) and the slow axis (B) each indicated by a dotted line overlap with each other. FIG. 2C shows that the transmission axis (A) and the transmission axis (B) are in a crossed nicol state, and the slow axis (A) and the slow axis (B) are also in a crossed nicol state.

These polarizing plates can be formed from a known material. For example, a structure can be employed, in which an adhesive surface, TAC (triacetylcellulose), a mixed layer of PVA (polyvinyl alcohol) and iodine, and TAC are sequentially stacked from the substrate side. A polarization degree can be controlled with the use of the mixed layer of PVA (polyvinyl alcohol) and iodine. The polarizing plate is also referred to as a polarizing film from the viewpoint of its shape.

The transmission axis exists in a direction orthogonal to an absorption axis in terms of characteristics of the polarizing plate. Therefore, a case where the transmission axes are parallel to each other can also be referred to as "parallel nicol state".

A fast axis exists in a direction orthogonal to the slow axis in terms of characteristics of the retardation film. Therefore, arrangement of the retardation film and the polarizing plate can be determined using not only the slow axis but also the fast axis. In this embodiment mode, the transmission axis and the slow axis are arranged to be shifted from each other by 45°; therefore, in other words, the transmission axis and the fast axis are arranged to be shifted from each other by 135°.

As the circularly polarizing plate, a circularly polarizing plate with a widened band is given. The circularly polarizing plate with a widened band is an object in which a wavelength range in which retardation of an s wave and a p wave is 90°, is widened by stacking several retardation films. Also in this case, a slow axis of each retardation film arranged on an outer side of the first light transmitting substrate 101 and a slow axis of each retardation film arranged on an outer side of the second light transmitting substrate 102 may be arranged to be at 90°, and transmission axes of opposed polarizing plates may be arranged to be in a crossed nicol state.

Light leakage in the absorption axis direction can be reduced by stacking so that the transmission axes of the stacked polarizing plates are arranged to be in a parallel nicol state in this manner. The opposed polarizing plates are arranged to be in a crossed nicol state. By providing a circularly polarizing plate having such polarizing plates, light leakage can be further reduced in comparison to a circularly polarizing plate in which single layers of a polarizing plate are arranged to be in a crossed nicol state. Accordingly, a contrast ratio of a display device can be increased.

Embodiment Mode 2

In this embodiment mode, a concept of a display device will be explained, in which a transmission axis (A) and a transmission axis (B) are in a parallel nicol state, in other words, opposed polarizing plates are in a parallel nicol state, unlike the above embodiment mode.

As shown in FIG. 3, a layer 100 having an electroluminescent element is interposed between a first light transmitting substrate 201 and a second light transmitting substrate 202. Light from the electroluminescent element is emitted to the first light transmitting substrate 201 side and the second light transmitting substrate 202 side. A retardation film (A) 213, a first polarizing plate (A) 211, and a second polarizing plate (A) 212 are sequentially provided on an outer side of the first light transmitting substrate 201. A transmission axis (A) of the first polarizing plate (A) 211 and a transmission axis of the second polarizing plate (A) 212, namely stacked polarizing plates (A) are arranged to be in a parallel nicol state. A slow axis (A) of the retardation film (A) 213 is arranged to be shifted from the transmission axis (A) of the first polarizing plate (A) 211 and the transmission axis (A) of the second polarizing plate (A) 212 by 45°.

Figure 4A:
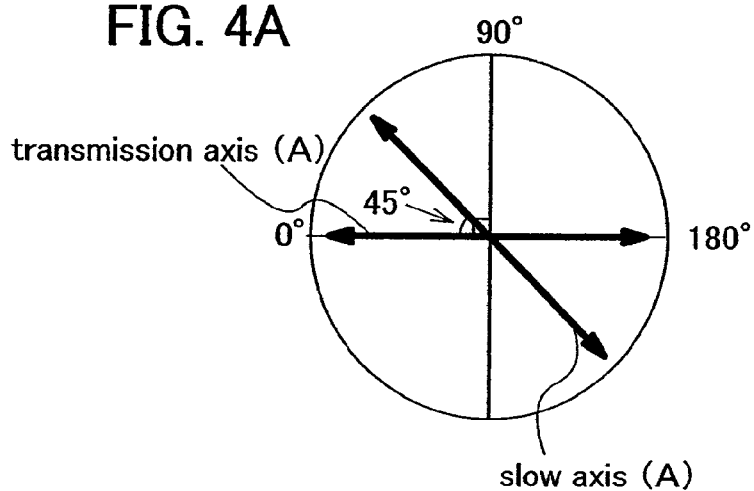
FIGS. 4A to 4C are views each showing an optical axis of the present invention.

FIG. 4A shows an angular deviation of the transmission axis (A) and the slow axis (A). The slow axis (A) is at 45° and the transmission axis (A) is at 0°, which means they are shifted from each other by 45°.

A retardation film (B) 223, a first polarizing plate (B) 221, and a second polarizing plate (B) 222 are sequentially provided on an outer side of the second light transmitting substrate 202. The first polarizing plate (B) 221 and the second polarizing plate (B) 222, namely stacked polarizing plates (B) are arranged to be in a parallel nicol state. A slow axis (B) of the retardation film (B) 223 is arranged to be shifted from a transmission axis (B) of the first polarizing plate (B) 221 and a transmission axis (B) of the second polarizing plate (B) 222 by 45°.

Figure 4B:
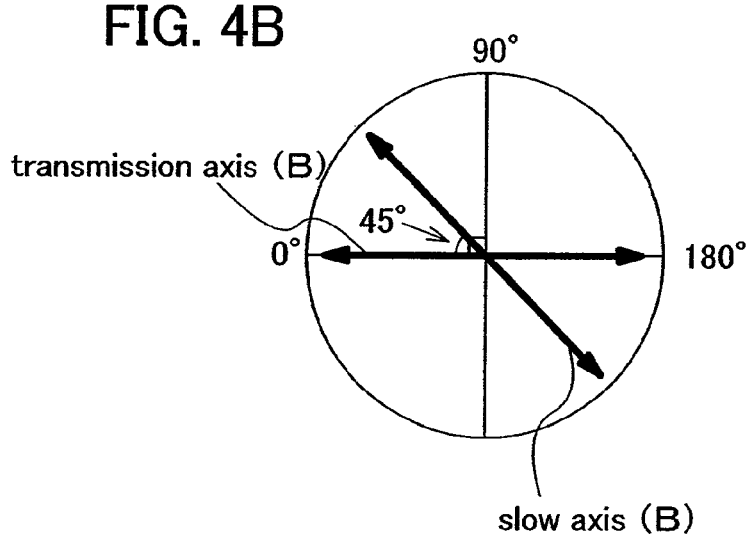

FIG. 4B shows an angular deviation of the transmission axis (B) and the slow axis (B). The slow axis (B) is at 45° and the transmission axis (B) is at 0°, which means they are shifted from each other by 45°. In other words, the slow axis of the retardation film (A) is arranged to be at 45° with respect to the transmission axis of the first polarizing plate, namely shifted from the transmission axis of the first polarizing plate by 45°; the slow axis of the retardation film (B) is arranged to be at 45° with respect to the transmission axis of the second polarizing plate, namely shifted from the transmission axis of the second polarizing plate by 45°; and the transmission axes of stacked polarizing plates (B) are arranged to be at 0° with respect to the transmission axes of stacked polarizing plates (A), namely shifted from the transmission axes of stacked polarizing plates (A) by 0°.

Unlike the above embodiment mode, another feature of the present invention is that the transmission axes (A) of stacked polarizing plates (A) provided for the first light transmitting substrate 201 and the transmission axis (B) of stacked polarizing plates (B) provided for the second light transmitting substrate 202 are parallel to each other. In other words, stacked polarizing plates (A) and stacked polarizing plates (B), namely opposed polarizing plates are arranged to be in a parallel nicol state.

Figure 4C:
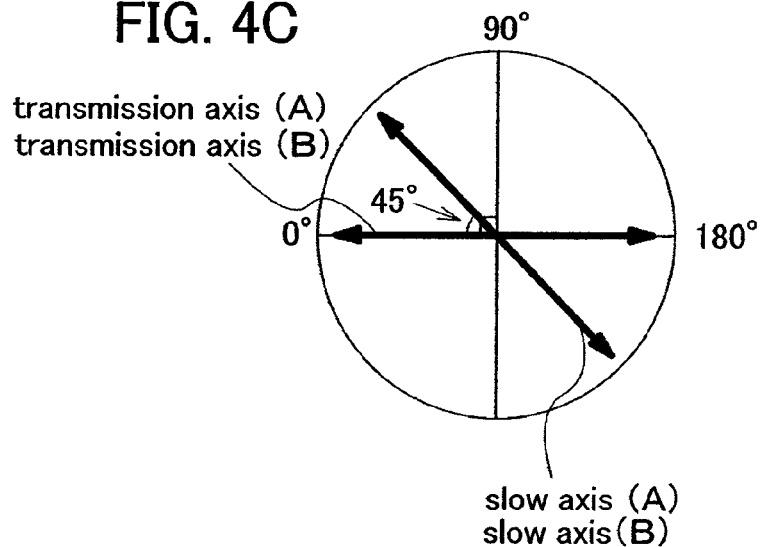

FIG. 4C shows a state where the transmission axis (A) and the slow axis (A), and the transmission axis (B) and the slow axis (B) overlap with each other. It can be seen that the state is a parallel nicol state.

As the circularly polarizing plate, a circularly polarizing plate with a widened band is given. The circularly polarizing plate with a widened band is an object in which a wavelength range in which retardation of an s wave and a p wave is 90°, is widened by stacking the several retardation films. Also in this case, slow axes of each retardation film arranged on an outer side of the light transmitting substrate 201 and slow axes of each retardation film arranged on an outer side of the light transmitting substrate 202 may be arranged to be parallel to each other, and transmission axes of opposed polarizing plates may be arranged to be in a parallel nicol state.

Light leakage in the absorption axis direction can be reduced by stacking so that transmission axes of the stacked polarizing plates are arranged in a parallel nicol state in this manner. Further, the opposed polarizing plates are arranged to be in a parallel nicol state. By providing such a circularly polarizing plate, light leakage can be reduced in comparison to a circularly polarizing plate in which single layers of polarizing plates are arranged to be in a parallel nicol state. Accordingly, a contrast ratio of a display device can be increased.

When a circularly polarizing plate with a widened band is used, black display can be performed in some cases even if arrangement of the transmission axis of the polarizing plate and the slow axis of the retardation film is different from Embodiment Modes 1 and 2. However, also at this time, if the transmission axes of the polarizing plates to be stacked are arranged to be in a parallel nicol state in the same manner as Embodiment Modes 1 and 2, a contrast ratio can be increased.

Embodiment Mode 3

In this embodiment mode, a concept of a display device using a circularly polarizing plate having stacked polarizing plates and a circularly polarizing plate having one polarizing plate will be explained.

Figure 17:
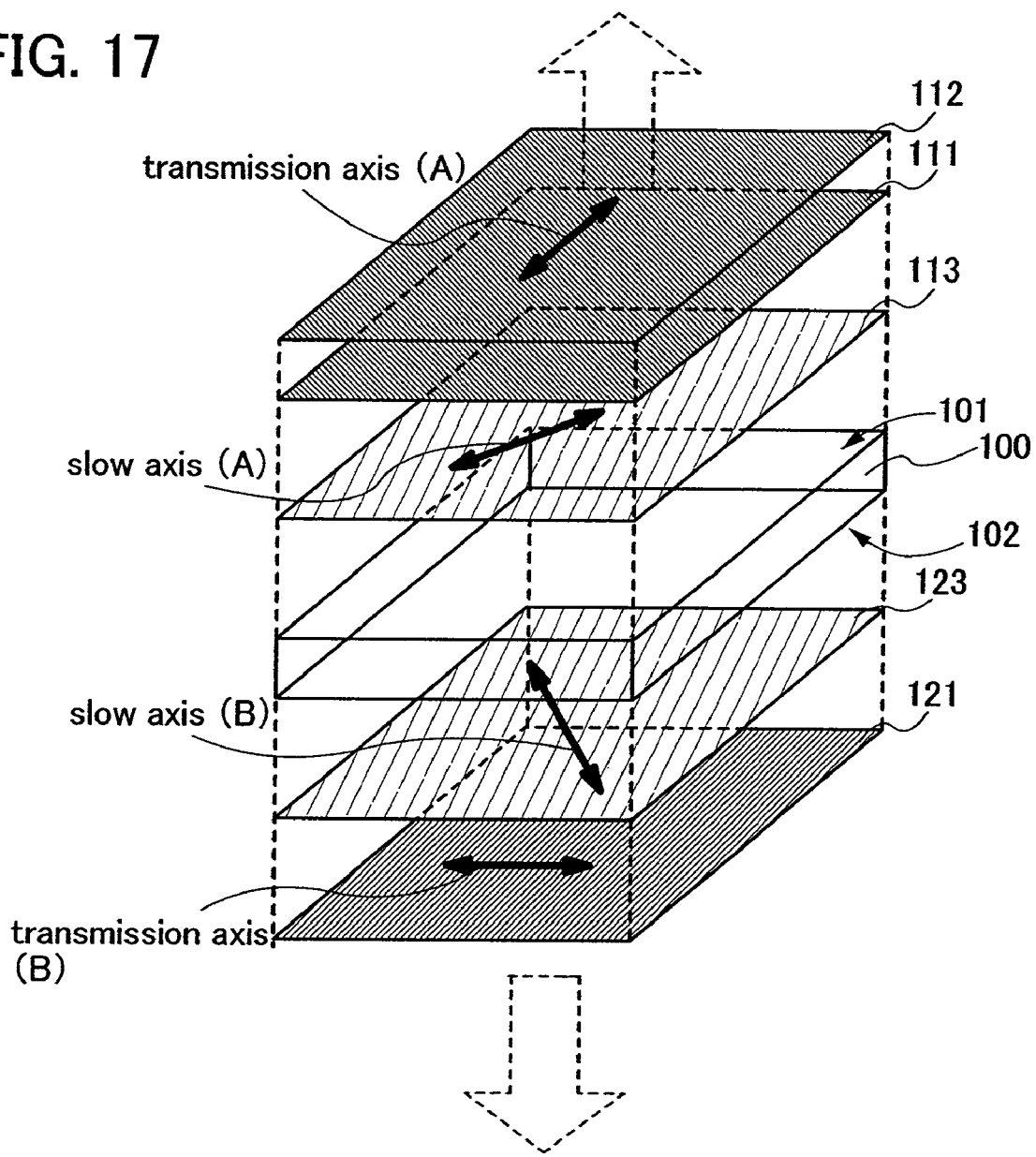
FIG. 17 is a view showing a display device of the present invention.

As shown in Embodiment Mode 1 described above, opposed polarizing plates are arranged to be in a crossed nicol state. As shown in FIG. 17, on the first light transmitting substrate 101 side, a retardation film (A) 113, a first polarizing plate (A) 111, and a second polarizing plate (A) 112 are sequentially arranged from the substrate side. In other words, stacked polarizing plates are formed using the first polarizing plate (A) 111 and the second polarizing plate (A) 112 on the first light transmitting substrate 101 side. On the other hand, on the second light transmitting substrate 102 side, a retardation film (B) 123 and a first polarizing plate (B) 121 are sequentially arranged from the substrate side. In other words, a polarizing plate having a single layer structure is formed using the first polarizing plate (B) 121 on the second light transmitting substrate 102 side. A structure except that is the same as FIG. 1; therefore, the explanation is omitted.

Figure 18:
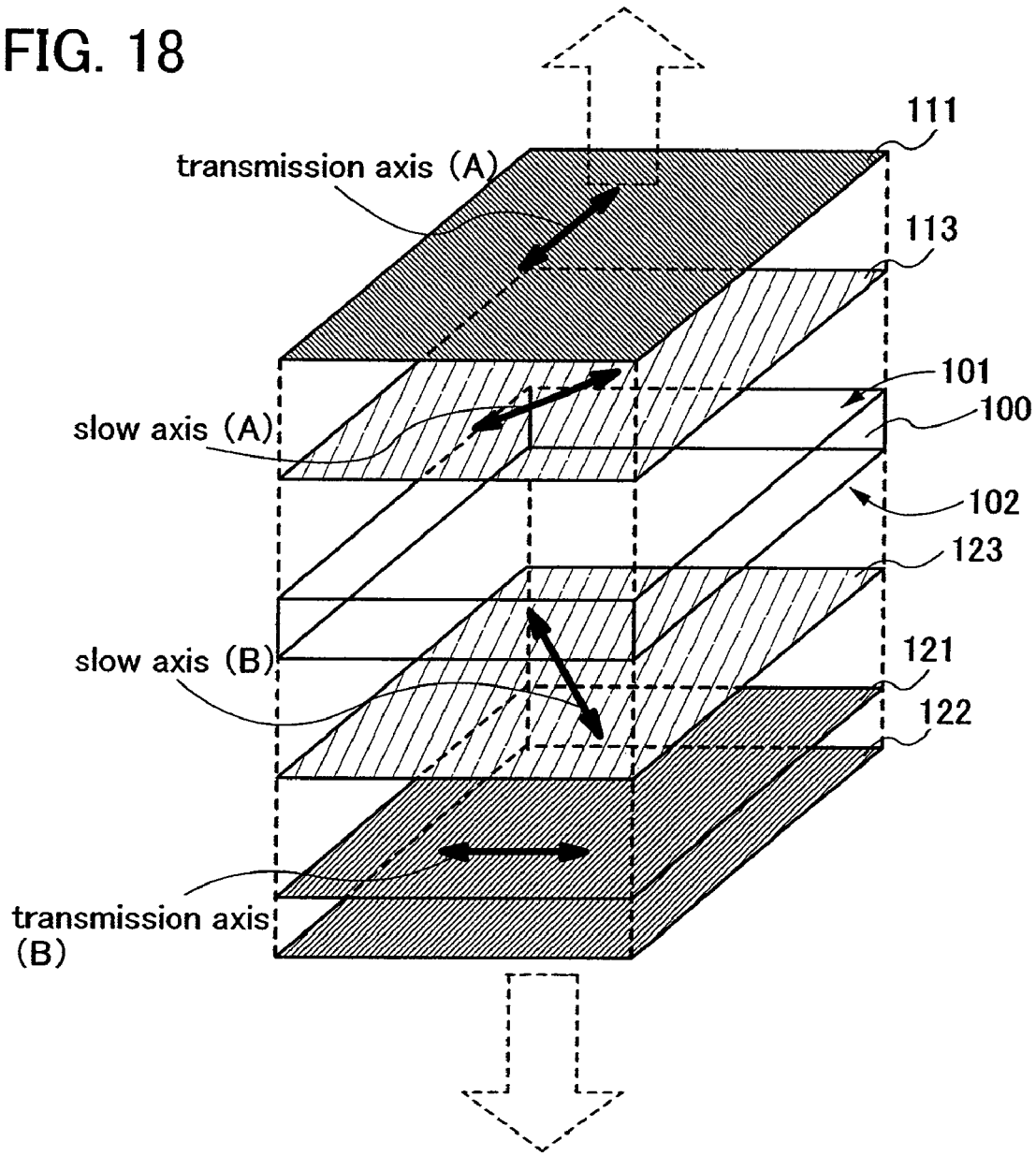
FIG. 18 is a view showing a display device of the present invention.

Alternatively, as shown in FIG. 18, on the first light transmitting substrate 101 side, a retardation film (A) 113 and a first polarizing plate (A) 111 are sequentially arranged from the substrate side. In other words, a polarizing plate having a single layer structure is formed using the first polarizing plate (A) 111 on the first light transmitting substrate 101 side. On the other hand, on the second light transmitting substrate 102 side, a retardation film (B) 123, a first polarizing plate (B) 121, and a second polarizing plate (B) 122 are sequentially arranged from the substrate side. In other words, stacked polarizing plates are formed using the first polarizing plate (B) 121 and the second polarizing plate (B) 122 on the second light transmitting substrate 102 side. A structure except that is the same as FIG. 1; therefore, the explanation is omitted.

Light leakage in the absorption axis direction can also be reduced by providing one of circularly polarizing plates with stacked polarizing plates and arranging transmission axes of the opposed polarizing plates to be in a crossed nicol state in this manner. Accordingly, a contrast ratio of a display device can be increased.

Embodiment Mode 4

In this embodiment mode, a concept of a display device using a circularly polarizing plate having stacked polarizing plates and a circularly polarizing plate having one polarizing plate will be explained.

Figure 19:
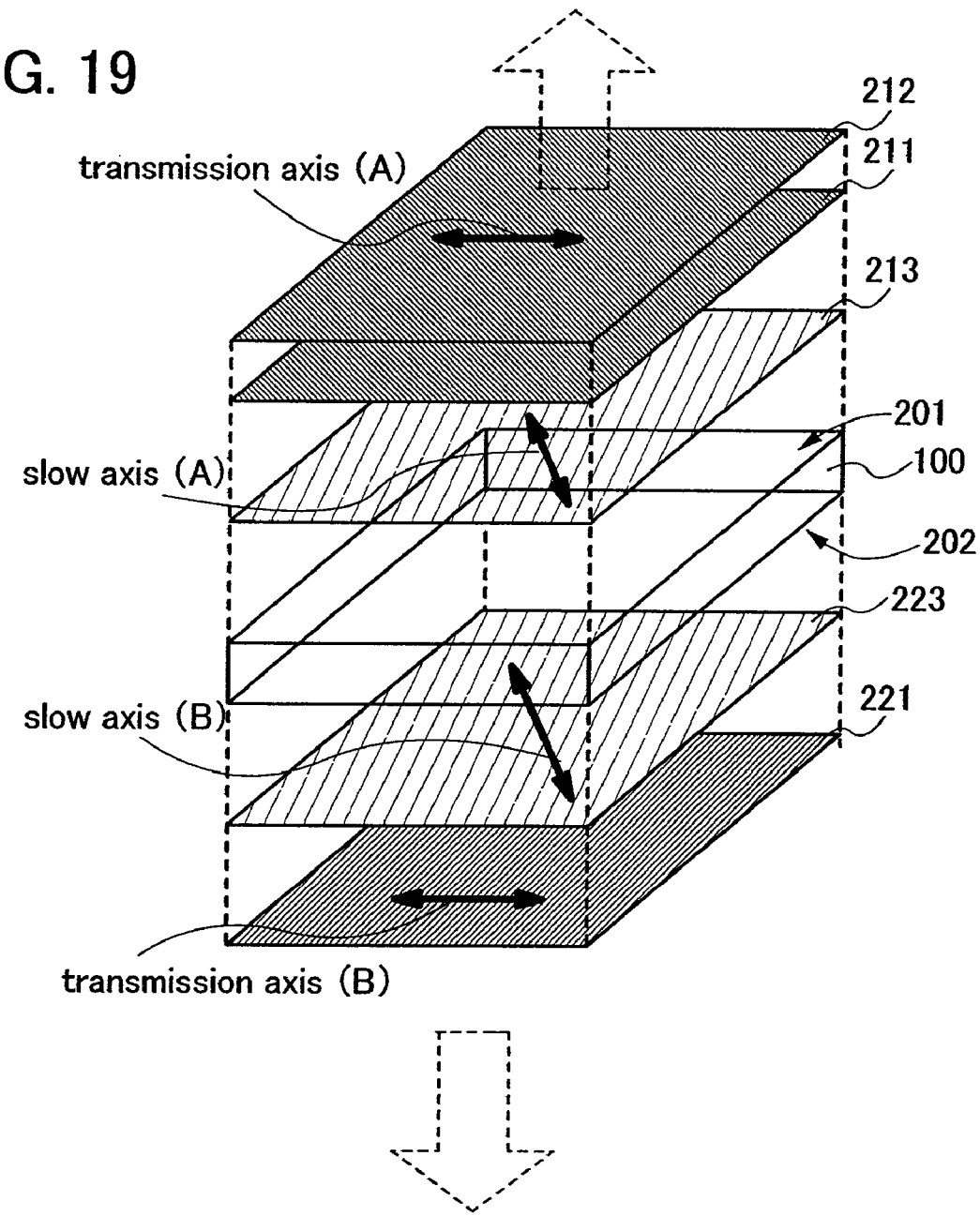
FIG. 19 is a view showing a display device of the present invention.

As shown in Embodiment Mode 2 described above, opposed polarizing plates are arranged to be in a parallel nicol state. As shown in FIG. 19, on the first light transmitting substrate 201 side, a retardation film (A) 213, a first polarizing plate (A) 211, and a second polarizing plate (A) 212 are sequentially arranged from the substrate side. In other words, stacked polarizing plates are formed using the first polarizing plate (A) 211 and the second polarizing plate (A) 212 on the first light transmitting substrate 201 side. On the other hand, on the second light transmitting substrate 202 side, a retardation film (B) 223 and a first polarizing plate (B) 221 are sequentially arranged from the substrate side. In other words, a polarizing plate having a single layer structure is formed using the first polarizing plate (B) 221 on the second light transmitting substrate 202 side. A structure except that is the same as FIG. 3; therefore, the explanation will be omitted.

Figure 20:
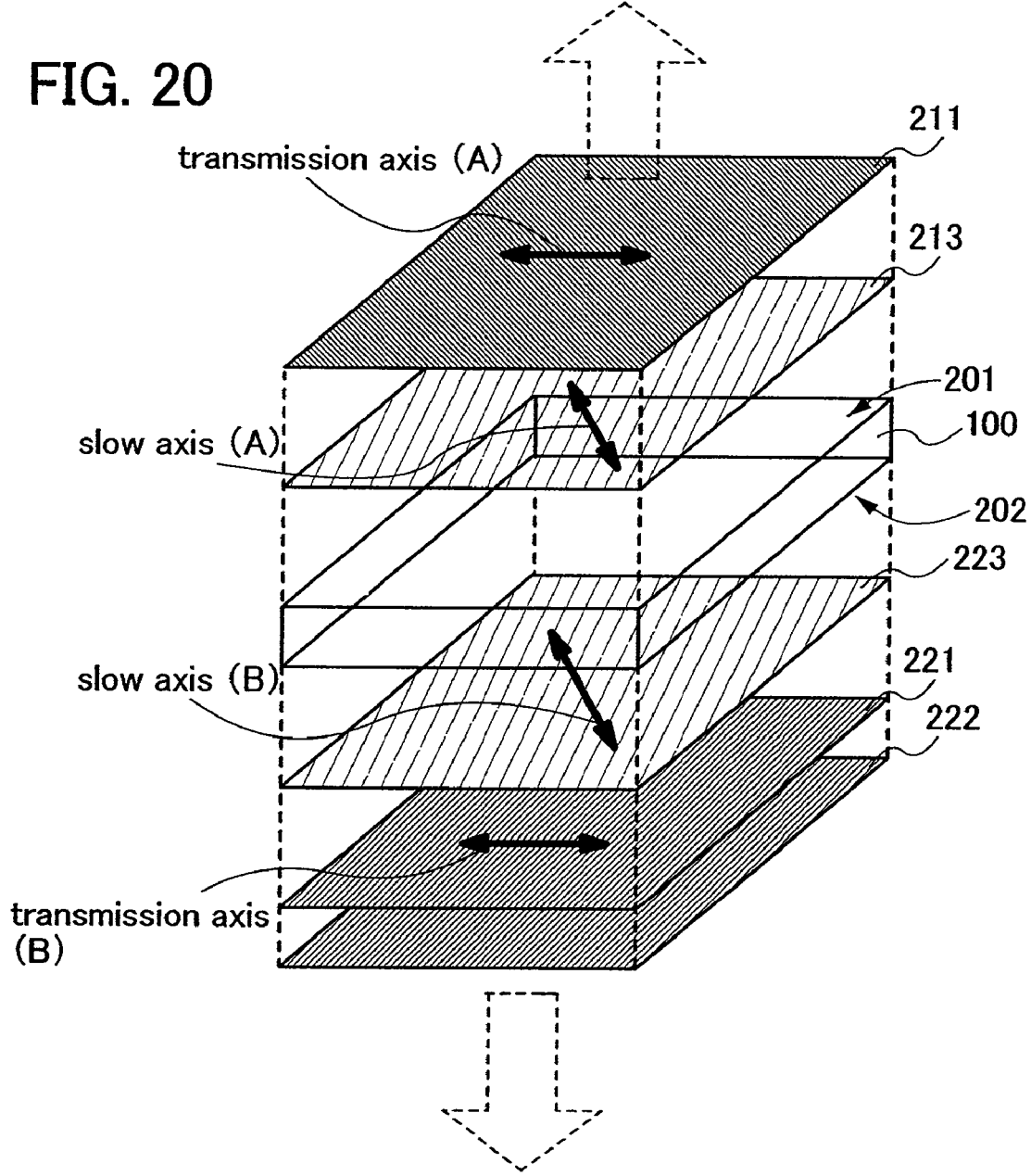
FIG. 20 is a view showing a display device of the present invention.

Alternatively, as shown in FIG. 20, on the first light transmitting substrate 201 side, a retardation film (A) 213 and a first polarizing plate (A) 211 are sequentially arranged from the substrate side. In other words, a polarizing plate having a single layer structure is formed using the first polarizing plate (A) 211 on the first light transmitting substrate 201 side. On the other hand, on the second light transmitting substrate 202 side, a retardation film (B) 223, a first polarizing plate (B) 221, and a second polarizing plate (B) 222 are sequentially arranged from the substrate side. In other words, stacked polarizing plates are formed using the first polarizing plate (B) 221 and the second polarizing plate (B) 222 on the second light transmitting substrate 202 side. A structure except that is the same as FIG. 3; therefore, the explanation will be omitted.

Light leakage in the absorption axis direction can also be reduced by providing one of circularly polarizing plates with stacked polarizing plates and arranging transmission axes of the opposed polarizing plates to be in a parallel nicol state in this manner. Accordingly, a contrast ratio of a display device can be increased.

Embodiment Mode 5

Figure 5:
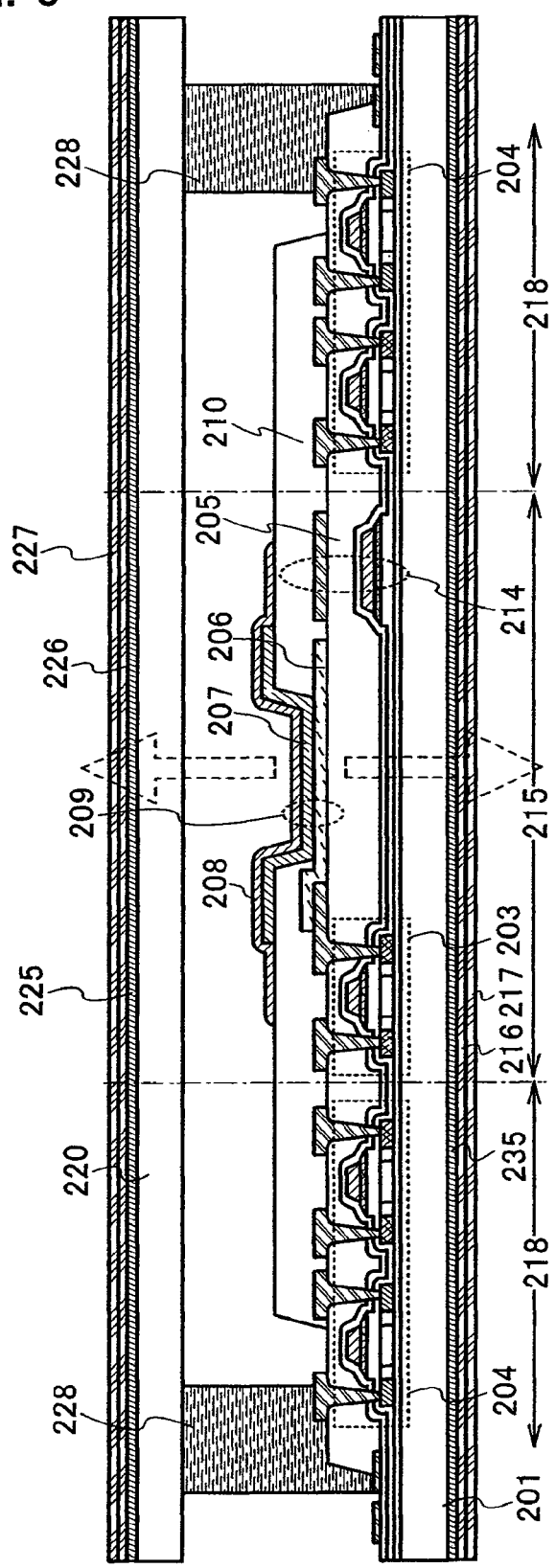
FIG. 5 is a view showing a display device of the present invention.

In this embodiment mode, a cross-sectional view of a display device of the present invention will be exemplified with reference to FIG. 5.

A thin film transistor is formed over a light transmitting substrate 201 having an insulating surface through an insulating layer. The thin film transistor (also referred to as a TFT) includes a semiconductor layer processed in a predetermined shape, a gate insulating layer covering the semiconductor layer, a gate electrode provided over the semiconductor layer through the gate insulating layer, and a source or drain electrode connected to an impurity layer in a semiconductor film. A material used for the semiconductor layer is a semiconductor material having silicon, and a crystalline state thereof may be any of amorphous, microcrystalline, and crystalline. An inorganic material is preferably used for the insulating layer typified by a gate insulating film, and silicon nitride or silicon oxide can be used. The gate electrode and the source or drain electrode may be formed from a conductive material, and tungsten, tantalum, aluminum, titanium, silver, gold, molybdenum, copper, or the like is included. The display device can be roughly divided into a pixel portion 215 and a driver circuit portion 218. A thin film transistor 203 provided in the pixel portion 215 is used as a switching element, and a thin film transistor 204 provided in the driver circuit portion is used as a CMOS circuit. In order to use the thin film transistor 204 as a CMOS circuit, a p-channel TFT and an N-channel TFT are included. The thin film transistor 203 can be controlled by the CMOS circuit provided in the driver circuit portion 218.

The insulating layer having a stacked structure or a single layer structure is formed to cover the thin film transistors. The insulating layer can be formed from an inorganic material or an organic material. As the inorganic material, silicon nitride or silicon oxide can be used. As the organic material, polyimide, acrylic, polyamide, polyimide amide, resist, benzocyclobutene, siloxane, polysilazane, or the like can be used. Siloxane is composed of a skeleton structure formed by the bond of silicon (Si) and oxygen (O), in which an organic group containing at least hydrogen (such as an alkyl group or an aromatic hydrocarbon) is included as a substituent. Alternatively, a fluoro group may be used as the substituent. Further alternatively, a fluoro group and an organic group containing at least hydrogen may be used as the substituent. Polysilazane is formed using a liquid material containing a polymer material having the bond of silicon (Si) and nitrogen (N) as a starting material. If the insulating layer is formed using an inorganic material, a surface thereof follows a depression/projection below. Alternatively, if the insulating layer is formed using an organic material, a surface thereof is planarized. For example, in a case where the insulating layer 205 is required to have planarity, it is preferable that an insulating layer 205 be formed using an organic material. It is to be noted that, even if an inorganic material is used, planarity can be obtained by thickly forming the material.

The source or drain electrode is manufactured by forming a conductive layer in an opening provided in the insulating layer 205 or the like. At this time, conductive layers serving as a wiring over the insulating layer 205 can be formed. A capacitor element 214 can be formed using a conductive layer of the gate electrode, the insulating layer 205, and a conductive layer of the source or drain electrode.

A first electrode 206 to be connected to any one of the source electrode and the drain electrode is formed. The first electrode 206 is formed using a material having a light transmitting property. As the material having a light transmitting property, indium tin oxide (ITO), zinc oxide (ZnO), indium zinc oxide (IZO), zinc oxide to which gallium is added (GZO), and the like can be given. Even if a non-light transmitting material such as rare-earth metal such as Yb or Er as well as alkali metal such as Li or Cs, alkaline earth metal such as Mg, Ca, or Sr, alloy including these (Mg:Ag, Al:Li, Mg:In, or the like), and a compound of these (calcium fluoride or calcium nitride), is used, the first electrode 206 can have a light transmitting property by being formed to be extremely thin. Therefore, a non-light transmitting material may be used for the first electrode 206.

An insulating layer 210 is formed to cover an edge portion of the first electrode 206. The insulating layer 210 can be formed in the same manner as the insulating layer 205. An opening is provided in the insulating layer 210 to cover the edge portion of the first electrode 206. An edge surface of the opening may have a tapered shape, whereby disconnection of a layer to be formed later can be prevented. For example, in a case where a non-photosensitive resin or a photosensitive resin is used for the insulating layer 210, a tapered shape can be provided in a side surface of the opening in accordance with an exposure condition.

Thereafter, an electroluminescent layer 207 is formed in the opening of the insulating layer 210. The electroluminescent layer includes a layer having each function, specifically, a hole injecting layer, a hole transporting layer, a light emitting layer, an electron transporting layer, and an electron injecting layer. A boundary of each layer is not necessarily clear, and there may be a case that part of the boundary is mixed.

A specific material for forming the light emitting layer will be exemplified hereinafter. When reddish emission is desired to be obtained, 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidin-9-yl)ethenyl]-4H-pyr an (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonate) (abbreviation: Ir[Fdpq]$_2$(acac)), or the like can be used for the light emitting layer. However, it is not limited to these materials, and a substance which exhibits emission with a peak from 600 nm to 700 nm in an emission spectrum can be used.

When greenish emission is desired to be obtained, N,N'-dimethylquinacridone (abbreviation: DMQd), coumarin 6, coumarin 545T, tris(8-quinolinolato)aluminum (abbreviation: Alq$_3$), or the like can be used for the light emitting layer. However, it is not limited to these materials, and a substance which exhibits emission with a peak from 500 to 600 nm in an emission spectrum can be used.

When bluish emission is desired to be obtained, 9,10-bis (2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), or the like can be used for the light emitting layer. However, it is not limited to these materials, and a substance which exhibits emission with a peak from 400 to 500 nm in an emission spectrum can be used.

When whitish emission is desired to be obtained, a structure can be used, in which TPD (aromatic diamine), 3-(4-tert-butylphenyl)-4-phenyl-5-(4-biphenylyl)-1,2,4-triazole (abbreviation: TAZ), tris(8-quinolinolato)aluminum (abbreviation: Alq$_3$), Alq$_3$ doped with Nile Red which is red luminescent pigment, and Alq$_3$ are stacked by an evaporation method or the like.

Then, a second electrode 208 is formed. The second electrode 208 can be formed in the same manner as the first electrode 206. A light emitting element 209 having the first electrode 206, the electroluminescent layer 207, and the second electrode 208 can be formed.

At this time, since the first electrode 206 and the second electrode 208 each have a light transmitting property, light can be emitted in both directions from the electroluminescent layer 207. Such a display device which can emit light in both directions can be referred to as a dual emission display device.

The light transmitting substrate 201 and an opposing substrate 220 are attached to each other by a sealing member 228. In this embodiment mode, the sealing member 228 is provided over part of the driver circuit portion 218; therefore, a narrow frame can be attempted. As a matter of course, arrangement of the sealing member 228 is not limited thereto. The sealing member 228 may be provided outside the driver circuit portion 218.

A space formed by the attachment is filled with an inert gas such as nitrogen and sealed, or filled with a resin material having a light transmitting property and high hygroscopicity. Accordingly, intrusion of moisture or oxygen, which becomes one factor of deterioration of the light emitting element 209 can be prevented. Further, a spacer may be provided to keep a distance between the light transmitting substrate 201 and the opposing substrate 220, and the spacer may have hygroscopicity. The spacer has a spherical or columnar shape.

The opposing substrate 220 can be provided with a color filter or a black matrix. Even in a case where a single color light emitting layer, for example, a white light emitting layer is used, full-color display is possible by the color filter. Further, even in a case where a light emitting layer of each R, G, and B is used, a wavelength of light to be emitted can be controlled by providing the color filter, whereby clear display can be provided. By the black matrix, reflection of external light caused by a wiring or the like can be reduced.

Then, a retardation film 235, a first polarizing plate 216, and a second polarizing plate 217 are provided on an outer side of the light transmitting substrate 201, and a retardation film 225, a first polarizing plate 226, and a second polarizing plate 227 are provided on an outer side of the opposing substrate 220. In other words, a circularly polarizing plate having stacked polarizing plates is provided on each an outer side of the light transmitting substrate 201 and on an outer side of the opposing substrate 220. Accordingly, deep black can be obtained, and a contrast ratio can be increased.

In this embodiment mode, a mode is shown, in which the driver circuit portion is formed in an integrated manner over the light transmitting substrate 201. However, an IC circuit formed from a silicon wafer may be used for the driver circuit portion. In this case, a picture signal or the like from the IC circuit can be inputted to a switching TFT 203 through a connecting terminal or the like.

This embodiment mode is explained using an active matrix display device. However, a circularly polarizing plate having stacked polarizing plates can be provided even in a passive display device. Accordingly, a contrast ratio can be increased.

This embodiment mode can be freely combined with the above embodiment modes.

Embodiment Mode 6

In this embodiment mode, a structure of a display device having a pixel portion and a driver circuit of the present invention will be explained.

Figure 6:
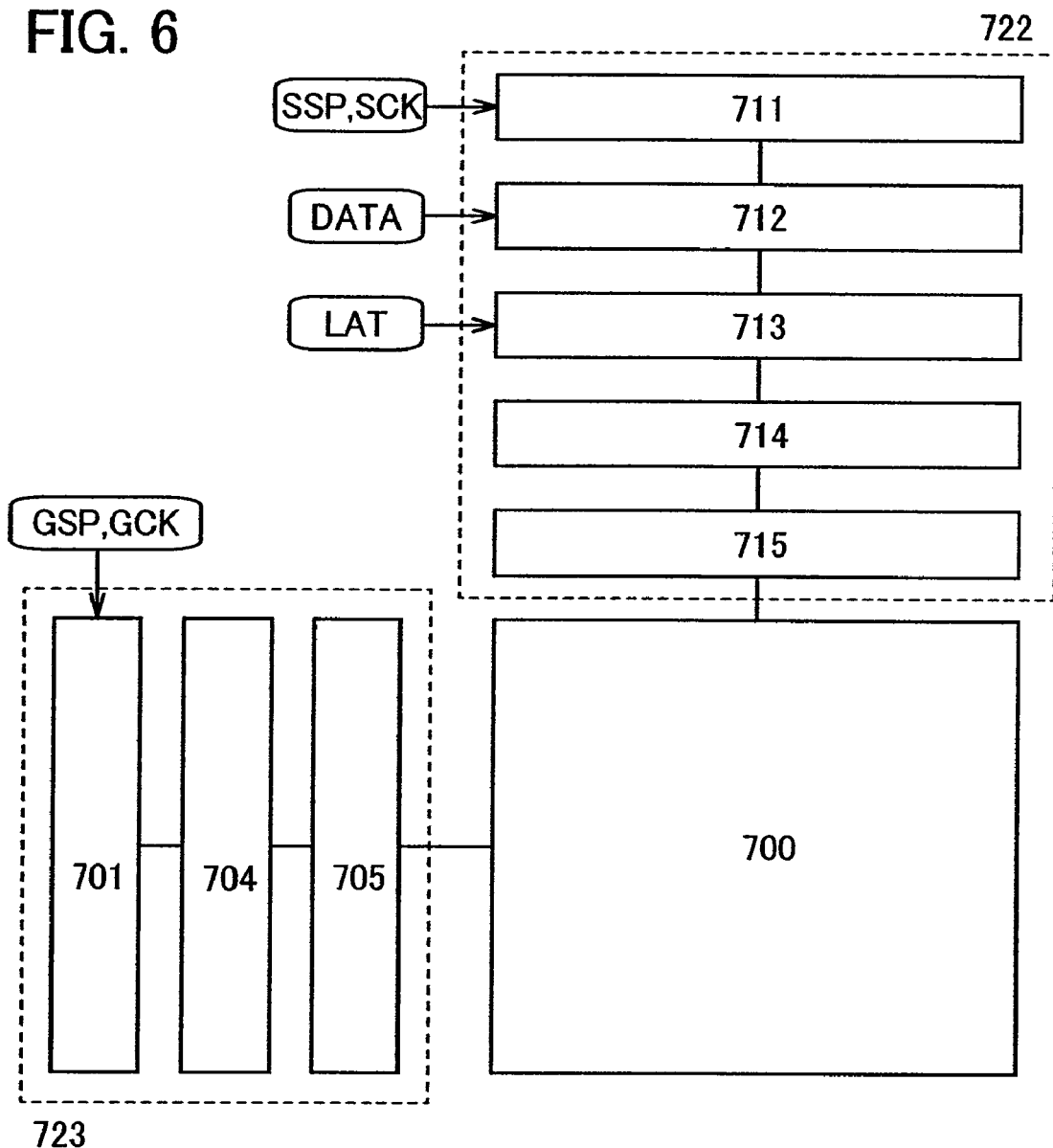
FIG. 6 is a block diagram showing a display device of the present invention.

FIG. 6 shows a block diagram of a state where a scanning line driver circuit 723 and a signal line driver circuit 722 are provided in the periphery of a pixel portion 700.

The pixel portion 700 has a plurality of pixels, and the pixel is provided with a light emitting element and a switching element.

The scanning line driver circuit 723 has a shift register 701, a level shifter 704, and a buffer 705. A signal is produced based on a start pulse (GSP) and a clock pulse (GCK) inputted to the shift register 701, and is inputted to the buffer 705 through the level shifter 704. A signal is amplified in the buffer 705 to be inputted to the pixel portion 700. The pixel portion 700 is provided with a light emitting element and a switching element which selects a light emitting element, and the signal from the buffer 705 is inputted to a gate line of the switching element. Accordingly, a switching element of a predetermined pixel is selected.

The signal line driver circuit 722 includes a shift register 711, a first latch circuit 712, a second latch circuit 713, a level shifter 714, and a buffer 715. A start pulse (SSP) and a clock pulse (SCK) are inputted to the shift register 711. A data signal (DATA) is inputted to the first latch circuit 712, and a latch pulse (LAT) is inputted to the second latch circuit 713. The DATA is inputted to the second latch circuit 713 based on the SSP and the SCK. The DATA for one row is held in the second latch circuit 713 to be inputted all together to the pixel portion 700.

The signal line driver circuit 722, the scanning line driver circuit 723, and the pixel portion 700 can be formed using a semiconductor element provided over the same substrate. For example, the signal line driver circuit 722, the scanning line driver circuit 723, and the pixel portion 700 can be formed using a thin film transistor provided for the insulating substrate explained in the above embodiment mode.

This embodiment mode can be freely combined with the above embodiment modes.

Embodiment Mode 7

In this embodiment mode, an equivalent circuit diagram of a pixel included in a display device will be explained with reference to FIGS. 7A to 7C.

Figure 7A:
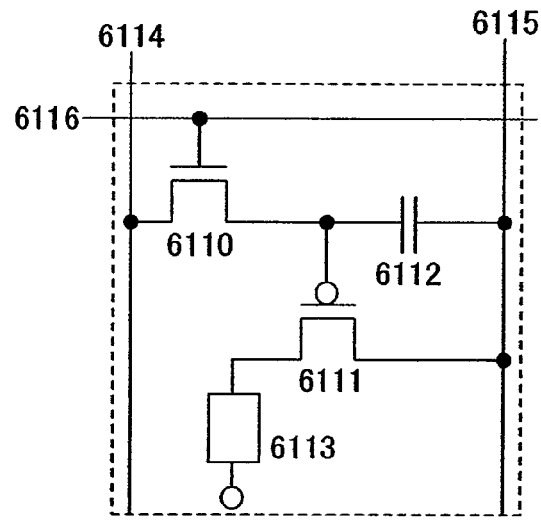
FIGS. 7A to 7C are diagrams each showing a pixel circuit included in a display device of the present invention.

FIG. 7A shows an example of an equivalent circuit diagram of a pixel, which includes a signal line 6114, a power supply line 6115, and a scanning line 6116, and in an intersection region thereof, a light emitting element 6113, transistors 6110 and 6111, and a capacitor element 6112. A picture signal (also referred to as a video signal) is inputted to the signal line 6114 by a signal line driver circuit. The transistor 6110 can control supply of an electric potential of the picture signal to a gate of the transistor 6111 in accordance with a selection signal inputted to the scanning line 6116. The transistor 6111 can control supply of a current to the light emitting element 6113 in accordance with an electric potential of the picture signal. The capacitor element 6112 can hold voltage between the gate and a source (referred to as gate-source voltage) of the transistor 6111. Although the capacitor element 6112 is shown in FIG. 7A, the capacitor element 6112 may not be provided in a case where a gate capacitance of the transistor 6111 or other parasitic capacitances can serve.

Figure 7B:
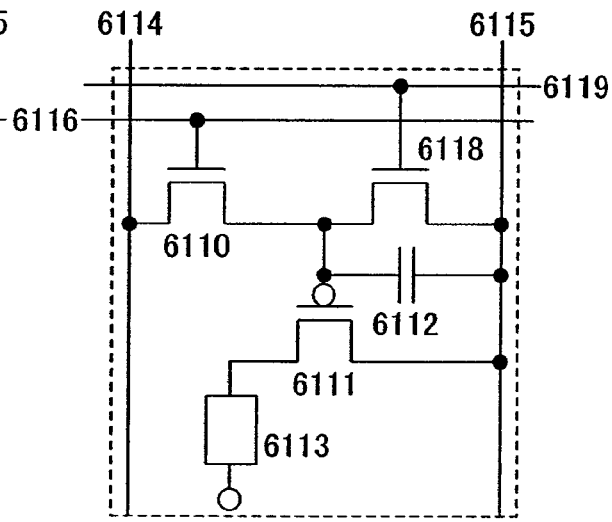

FIG. 7B is an equivalent circuit diagram of a pixel in which a transistor 6118 and a scanning line 6119 are newly provided in the pixel shown in FIG. 7A. The transistor 6118 makes it possible to make the electric potentials of the gate and source of the transistor 6111 equal to each other so that a state where no current flows in the light emitting element 6113 can be forcibly made. Therefore, a sub-frame period can be more shortened than a period during which a picture signal is inputted to all pixels.

Figure 7C:
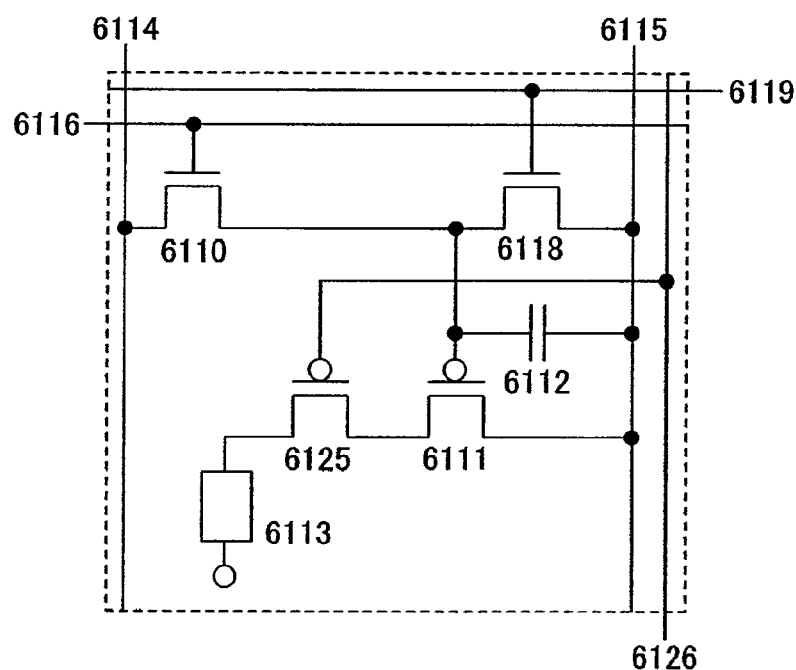

FIG. 7C is an equivalent circuit diagram of a pixel in which a transistor 6125 and a wiring 6126 are newly provided in the pixel shown in FIG. 7B. An electric potential of a gate of the transistor 6125 is fixed by the wiring 6126. The transistor 6111 and the transistor 6125 are connected in series between the power supply line 6115 and the light emitting element 6113. Accordingly, a value of a current supplied to the light emitting element 6113 can be controlled by the transistor 6125, and whether or not the current is supplied to the light emitting element 6113 can be controlled by the transistor 6111.

A pixel circuit included in a display device of the present invention is not limited to the configuration shown in this embodiment mode. For example, a pixel circuit having a current mirror may be employed, having a configuration which conducts analog gradation display.

This embodiment mode can be freely combined with the above embodiment modes.

Embodiment Mode 8

An electronic device according to the present invention includes: a television device (also simply referred to as a television or a television receiver), a camera such as a digital camera or a digital video camera, a cellular phone device (also simply referred to as a cellular phone handset or a cellular phone), a portable information terminal such as a PDA, a portable game machine, a monitor for a computer, a computer, a sound reproducing device such as a car audio set, an image reproducing device provided with a recording medium such as a home game machine, and the like. Specific examples thereof will be explained with reference to FIGS. 8A to 8F.

Figure 8A:
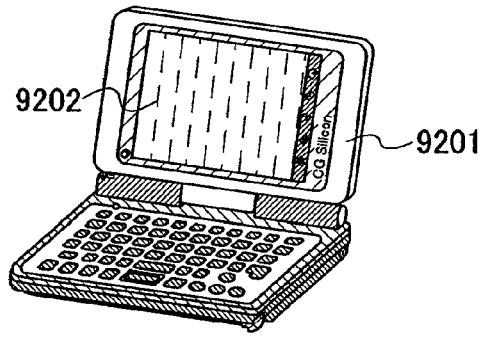
FIGS. 8A to 8F are views each showing an electronic device of the present invention.

A portable information terminal device shown in FIG. 8A includes a main body 9201, a display portion 9202, and the like. A display device of the present invention can be applied to the display portion 9202. As a result, a portable information terminal device with a high contrast ratio can be provided.

Figure 8B:
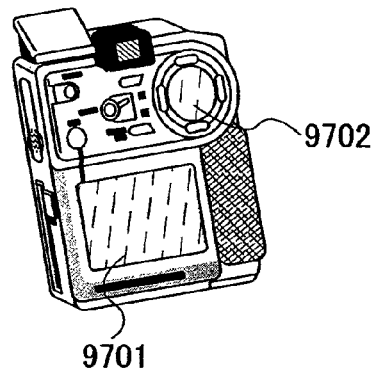

A digital video camera shown in FIG. 8B includes a display portion 9701, a display portion 9702, and the like. The display device of the present invention can be applied to the display portion 9701. As a result, a digital video camera with a high contrast ratio can be provided.

Figure 8C:
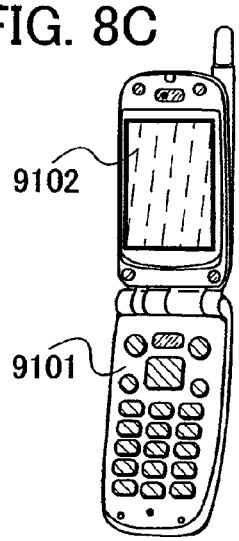

A cellular phone handset shown in FIG. 8C includes a main body 9101, a display portion 9102, and the like. The display device of the present invention can be applied to the display portion 9102. As a result, a cellular phone handset with a high contrast ratio can be provided.

Figure 8D:
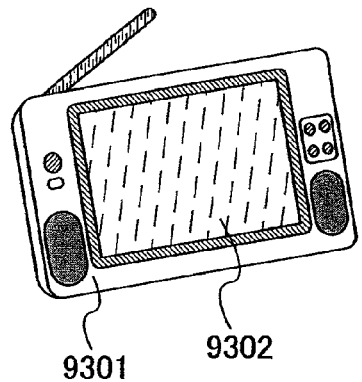

A portable television device shown in FIG. 8D includes a main body 9301, a display portion 9302, and the like. The display device of the present invention can be applied to the display portion 9302. As a result, a portable television device with a high contrast ratio can be provided. Further, the display device of the present invention can be applied to various types of television devices such as a small-sized television device incorporated in a portable terminal such as a cellular phone handset, a medium-sized television device which is portable, and a large-sized television device (for example, 40 inches or more).

Figure 8E:
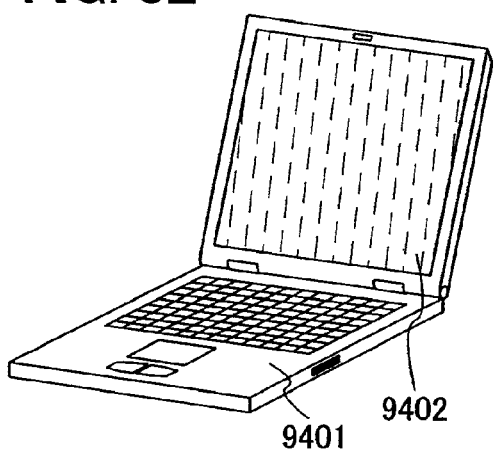

A portable computer shown in FIG. 8E includes a main body 9401, a display portion 9402, and the like. The display device of the present invention can be applied to the display portion 9402. As a result, a portable computer with a high contrast ratio can be provided.

Figure 8F:
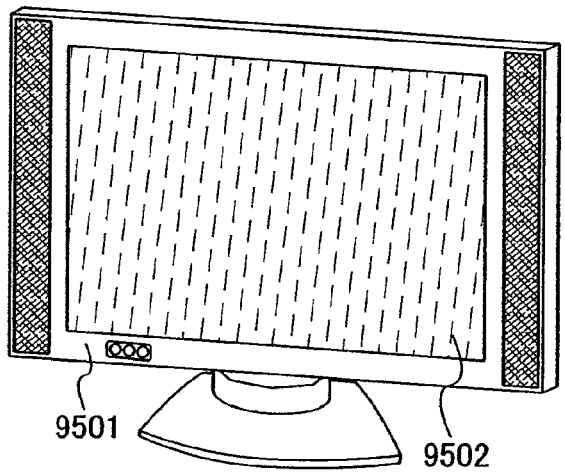

A television device shown in FIG. 8F includes a main body 9501, a display portion 9502, and the like. The display device of the present invention can be applied to the display portion 9502. As a result, a television device with a high contrast ratio can be provided.

As described above, by using the display device of the present invention, an electronic device with a high contrast ratio can be provided.

Embodiment 1

In this embodiment, a result of optical calculation using stacked polarizing plates and a retardation film will be explained. It is to be noted that a contrast ratio was calculated while the contrast ratio was defined as a ratio between transmittance of white display (referred to as white transmittance) and transmittance of black display (referred to as black transmittance) (white transmittance/black transmittance).

Optical systems shown in FIGS. 9A and 9B are assumed as black display. The optical systems are optical systems such that a light emitting layer of an electroluminescent element was not provided between λ/4 plates since black display in the electroluminescent element is in a non-light emitting state, and a backlight was arranged instead of external light since display under external light is assumed. As shown in FIG. 9A, slow axes of λ/4 plates were shifted from each other by 9°, and transmission axes of opposed polarizing plates were arranged in a crossed nicol state, and polarizing plates to be stacked were arranged to be in a parallel nicol state. As shown in FIG. 9B, slow axes of λ/4 plates were arranged to be parallel to each other, transmission axes of opposed polarizing plates were arranged to be in a parallel nicol state, and polarizing plates to be stacked were arranged to be in a parallel nicol state. In such optical systems arranged in this manner, transmittance with respect to luminance of the backlight was calculated, changing the number of polarizing plates to be stacked. The black transmittance is a result of optical calculation in the optical system.

Figure 10:
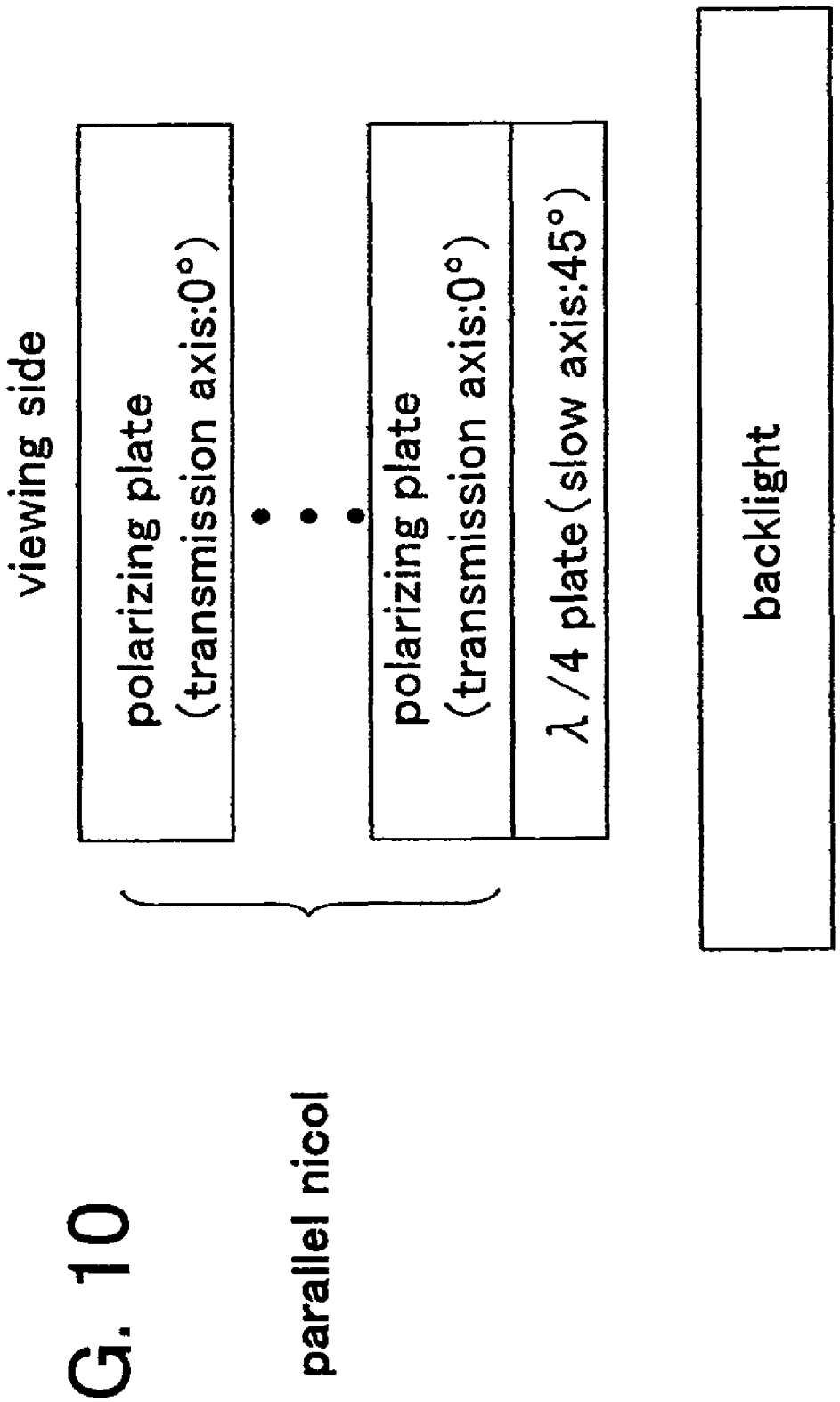
FIG. 10 is a view showing a measurement system of white transmittance of Embodiment 1.

An optical system shown in FIG. 10 is assumed as white display. The optical system is an optical system such that a backlight is used instead of emission in white display of an electroluminescent element. As shown in FIG. 10, a λ/4 plate was arranged over the backlight and a polarizing plate was arranged over the λ/4 plate. A λ/4 plate or the like on the opposite side was not arranged. At this time, a transmission axis of the polarizing plate was arranged to be shifted from a slow axis of the λ/4 plate by 45°. Polarizing plates to be stacked were arranged to be in a parallel nicol state. In such an optical system arranged in this manner, transmittance with respect to luminance of the backlight was calculated, changing the number of polarizing plates to be stacked. The optical system of white transmittance shown in FIG. 10 was arranged so that the transmission axis of the polarizing plate was shifted from the slow axis of the λ/4 plate by 45°; therefore, the white transmittance indicates white transmittance in both cases of a crossed nicol state shown in FIG. 9A and a parallel nicol state shown in FIG. 9B.

Calculation in this embodiment was performed using an optical calculation simulater for liquid crystal LCD MASTER (manufactured by SHINTECH, Inc). In performing optical calculation of transmittance with respect to a wavelength using the LCD MASTER, the optical calculation was performed using optical calculation algorithm having 2×2 matrix in which multiple interaction between elements was not considered, while a light source wavelength was set from 380 nm to 780 nm at intervals of 10 nm. As the λ/4 plate, a retardation film was used, retardation of which is 137.5 nm in the entire region of a wavelength of 380 nm to 780 nm. As the polarizing plate, a polarizing plate was used, in which, at a wavelength at 550 nm, n' and n" of the transmission axis were such that n'=1.5 and n"=3.22×e−5, respectively, and n' and n" of an absorption axis were such that n'=1.5 and n"=2.21×e−3, respectively, provided that a refractive index n was n'+in". A D65 light source was used for the backlight, and mixed circularly polarization was employed for a polarizing state.

Figure 11A:
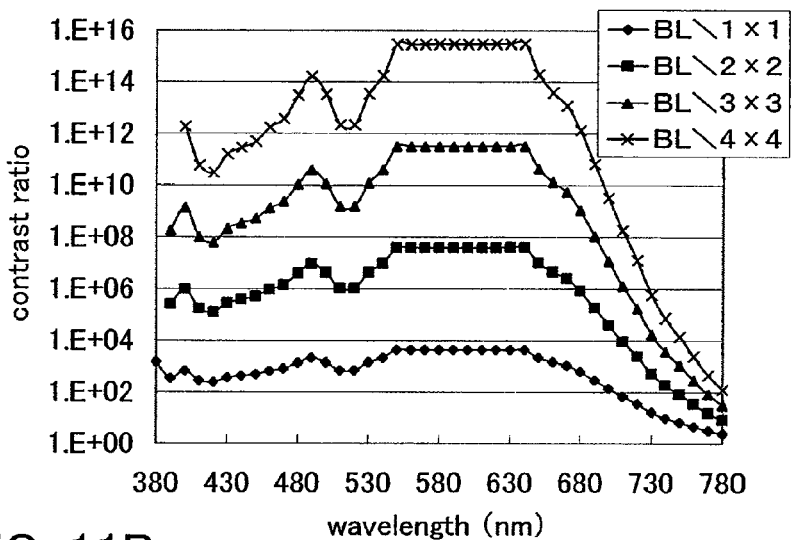
FIGS. 11A to 11C are graphs each showing a calculated result of Embodiment 1.
Figure 11B:
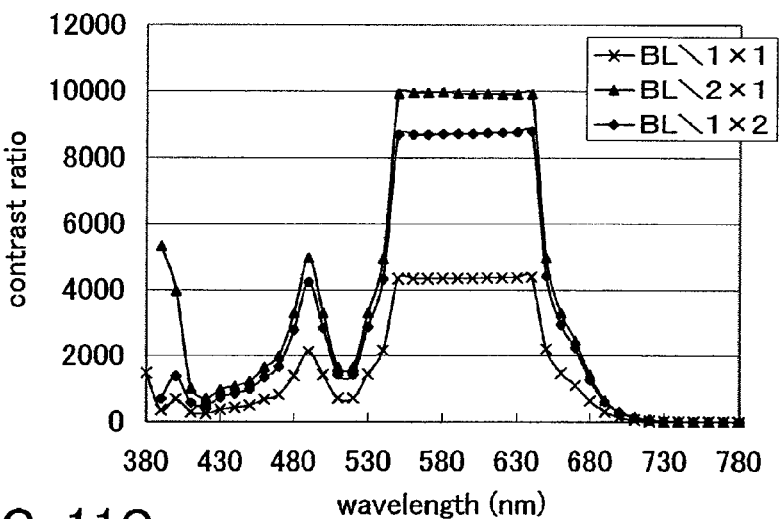
Figure 11C:
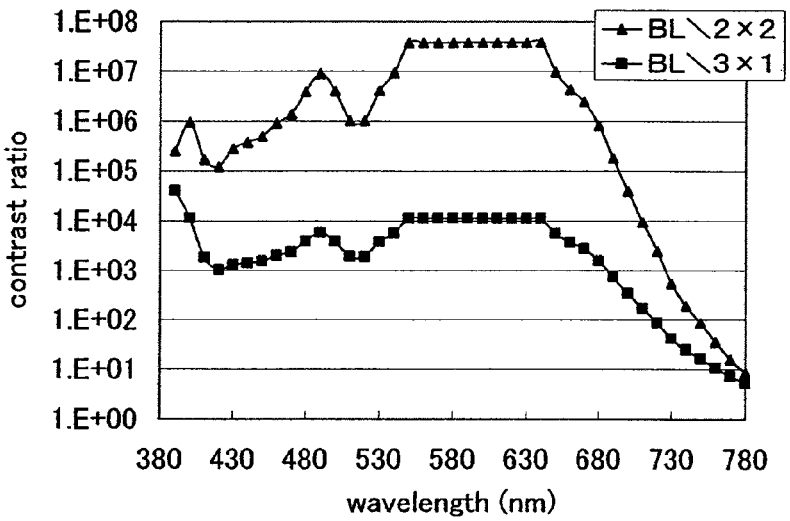

FIGS. 11A to 11C show a calculation result of a contrast ratio when the number of polarizing plates was changed in a case where the opposed polarizing plates are arranged to be in a crossed nicol state as shown in FIG. 9A. The contrast ratio was obtained from values of black transmittance of the optical system shown in FIG. 9A and white transmittance of the optical system shown in FIG. 10. "BL\2×1" in legends of the graphs means that a backlight (BL) is arranged, the number of polarizing plates on the backlight side is two, and the number of polarizing plates on the viewing side is one in FIG. 9A. Similarly, legends such as "BL\1×1", "BL\2×2", "BL\1×2", or "BL\3×1" refer to the number of polarizing plates on the backlight side and the number of polarizing plates on the viewing side.

Only the numeral at the end in the legends of the drawing is applied to the optical system shown in FIG. 10. In other words, numeral at the end of "BL\2×1" in the drawing means that a calculation result of a case where the number of polarizing plates is one in FIG. 10 is used. Similarly, only the numerals at the end in "BL\1×1", "BL\2×2", "BL\1×2", "BL\3×1", and the like are applied thereto. These refer to the number of polarizing plates.

With respect to samples arranged in this manner, a contrast ratio was obtained from a ratio between white transmittance and black transmittance (white transmittance/black transmittance).

FIG. 11A shows that a contrast ratio is increased as the number of polarizing plates is increased one by one. FIG. 11B shows that a contrast ratio is increased even if the number of polarizing plates is increased just by one on each side. Structures each having the same total number of polarizing plates, like "BL\1×2" and "BL\2×1", are compared. The result is that white transmittance of the structure having less polarizing plates on the viewing side is higher than that of the structure having more polarizing plates on the viewing side, while their black transmittances are the same. Therefore, a contrast ratio is increased when the viewing side has the smaller number of polarizing plates than the backlight side. FIG. 11C shows that a contrast ratio is increased when the number of polarizing plates on each side is 2 or more in structures each having the same total number of polarizing plates, like "BL\2×2" and "BL\3×1".

Figure 12A:
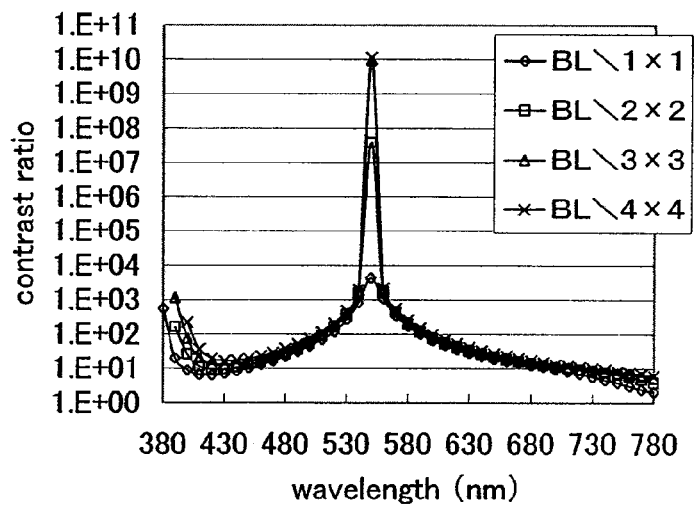
FIGS. 12A to 12C are graphs each showing a calculated result of Embodiment 1.
Figure 12B:
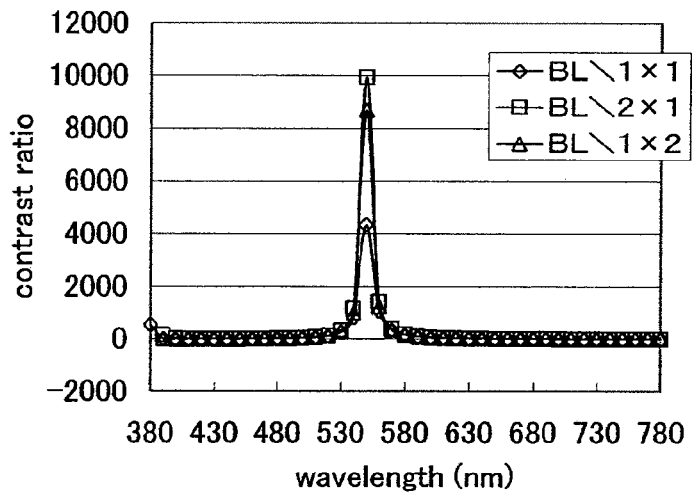
Figure 12C:
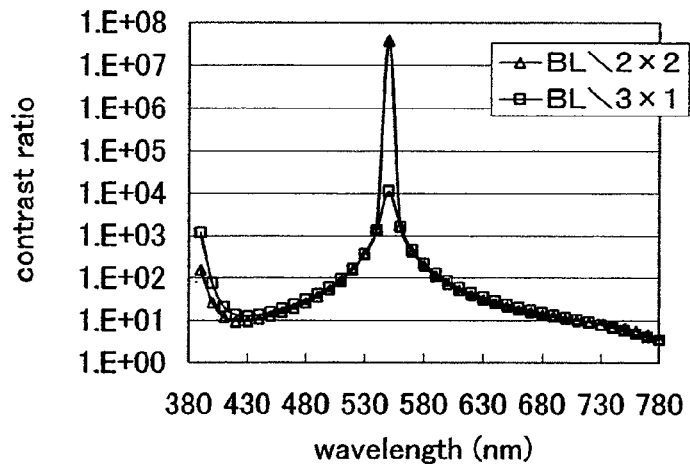

FIGS. 12A to 12C show a calculation result of a contrast ratio when the number of polarizing plates are changed while opposed polarizing plates are arranged to be in a parallel nicol state as shown in FIG. 9B. FIG. 12A shows that a contrast ratio is increased as the number of polarizing plates is increased one by one on each side. FIG. 12B shows that a contrast ratio is increased even if the number of polarizing plates is increased just by one on each side. Structures each having the same total number of polarizing plates, like "BL\1×2" and "BL\2×1", are compared. The result is that white transmittance of the structure having less polarizing plates on the viewing side is higher than that of the structure having more polarizing plates on the viewing side, while their black transmittances are the same. Therefore, a contrast ratio is increased when the viewing side has the smaller number of polarizing plates than the backlight side. FIG. 12C shows that a contrast ratio is increased when the number of polarizing plates on each side is 2 or more in structures each having the same total number of polarizing plates, like "BL\2×2" and "BL\3×1".

From these results, it is revealed that a contrast ratio is increased as the number of polarizing plates is increased even in a case where the opposed polarizing plates are arranged to be in a crossed nicol state or in a parallel nicol state. It is revealed that, when the number of polarizing plates is odd, a contrast ratio is increased when the number of polarizing plates on the viewing side is smaller than the backlight side. It is revealed that a contrast ratio is increased when the number of polarizing plates on each side is 2 or more in structures each having the same total number of polarizing plates.

When FIGS. 11A to 11C and FIGS. 12A to 12C are compared with each other, a high contrast ratio is obtained in a wide wavelength region in a case where the opposed polarizing plates are arranged to be in a crossed nicol state. On the contrary, in a case where the opposed polarizing plates are arranged to be in a parallel nicol state, a high contrast can be obtained only in the vicinity of a wavelength at 550 nm.

Figure 13:
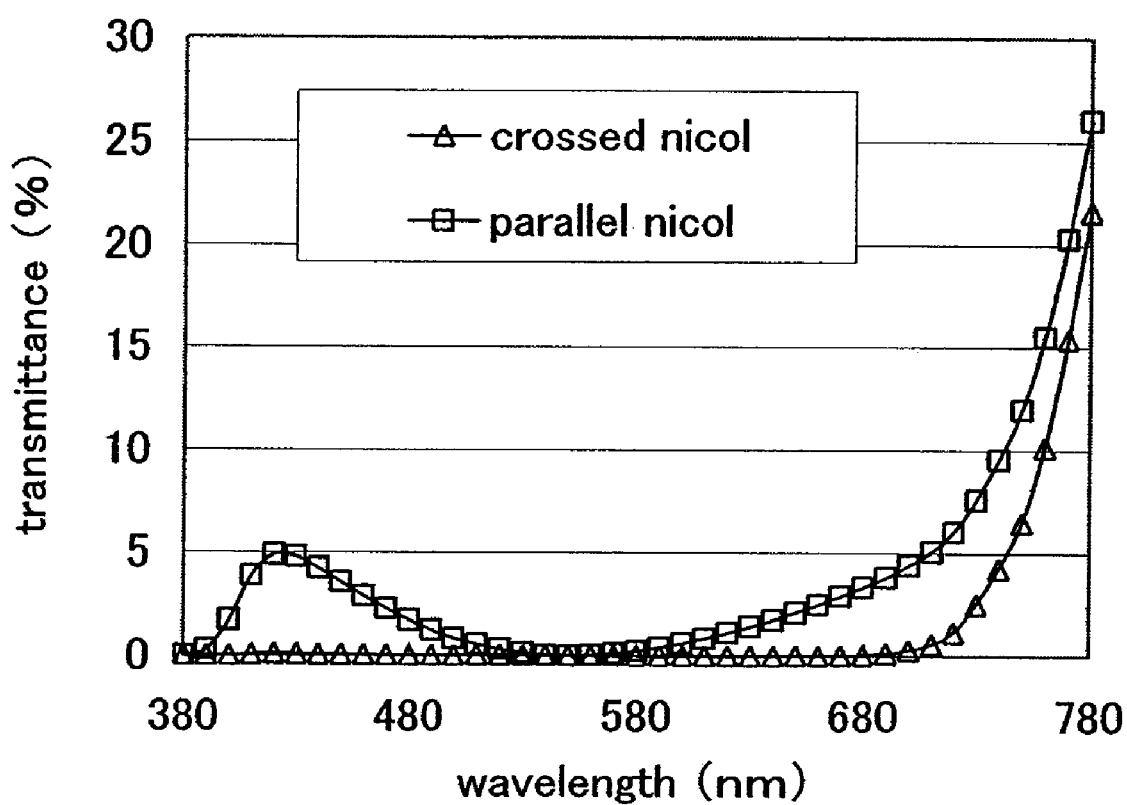
FIG. 13 is a graph showing a calculated result of Embodiment 1.

FIG. 13 shows wavelength dispersion characteristics of transmittance in the structure of "BL\1×1". In a case where the opposed polarizing plates are arranged to be in a crossed nicol state, it is revealed that transmittance is low in a wide wavelength region. On the contrary, in a case where the opposed polarizing plates are arranged to be in a parallel nicol state, it is revealed that transmittance is low only in the vicinity of a wavelength at 550 nm. On the other hand, white transmittance was the same whether the opposed polarizing plates are arranged to be in a crossed nicol state or in a parallel nicol state. Accordingly, a contrast ratio is different between a crossed nicol state of the opposed polarizing plates and a parallel nicol state of the opposed polarizing plates.

Light leakage can be reduced by arranging transmission axes of the polarizing plates to be stacked to be in a parallel nicol state in this manner. Further, by providing a circularly polarizing plate having opposed polarizing plates arranged to be in a parallel nicol state or in a crossed nicol state, light leakage can be reduced in comparison to a circularly polarizing plate in which polarizing plates each having a single layer structure are arranged to be in a parallel nicol state or in a crossed nicol state. Accordingly, a contrast ratio of a display device can be increased. It is to be noted that the opposed polarizing plates are preferably arranged to be in a crossed nicol state, whereby a high contrast ratio can be obtained in wideband.

Embodiment 2

In this embodiment, an experiment result of wavelength dispersion characteristics of black transmittance in a case where two opposed circularly polarizing plates are arranged to be in a crossed nicol state and in a parallel nicol state will be explained. Black luminance and white luminance were measured with respect to each sample, and a contrast ratio between white luminance and black luminance (white luminance/black luminance) was calculated. Although a contrast ratio in Embodiment 1 was obtained from (white transmittance/black transmittance), a contrast ratio can be calculated from both (white transmittance/black transmittance) and (white luminance/black luminance) since black transmittance is obtained from (black luminance/luminance of a backlight of reference) and white transmittance is obtained from (white luminance/luminance of a backlight of reference).

First, two circularly polarizing plates WB-CP-W (manufactured by Sumitomo Chemical Co., Ltd.) were attached to each other so that transmission axes of opposed polarizing plates were arranged to be in a crossed nicol state or in a parallel nicol state as shown in FIGS. 9A and 9B, and wavelength dispersion characteristics of transmittance were measured by a recording spectrophotometer U-4000 (manufactured by Hitachi, Ltd.). Here, the measurement was performed while the number of polarizing plates on each side was set to be one.

Figure 14:
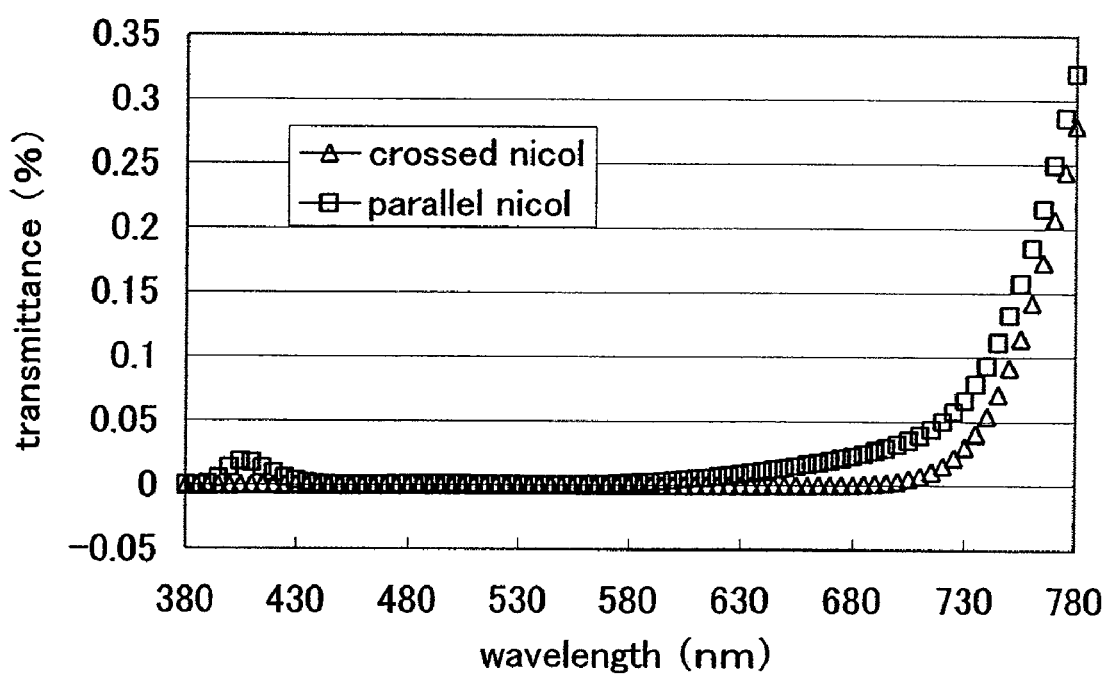
FIG. 14 is a graph showing a measurement result of Embodiment 2.

FIG. 14 shows the result. Similarly to the result of Embodiment 1, it is revealed that transmittance is low in a crossed nicol state than a parallel nicol state. In particular, difference in transmittance is large at a wavelength of 630 nm to 780 nm.

Figure 15A:
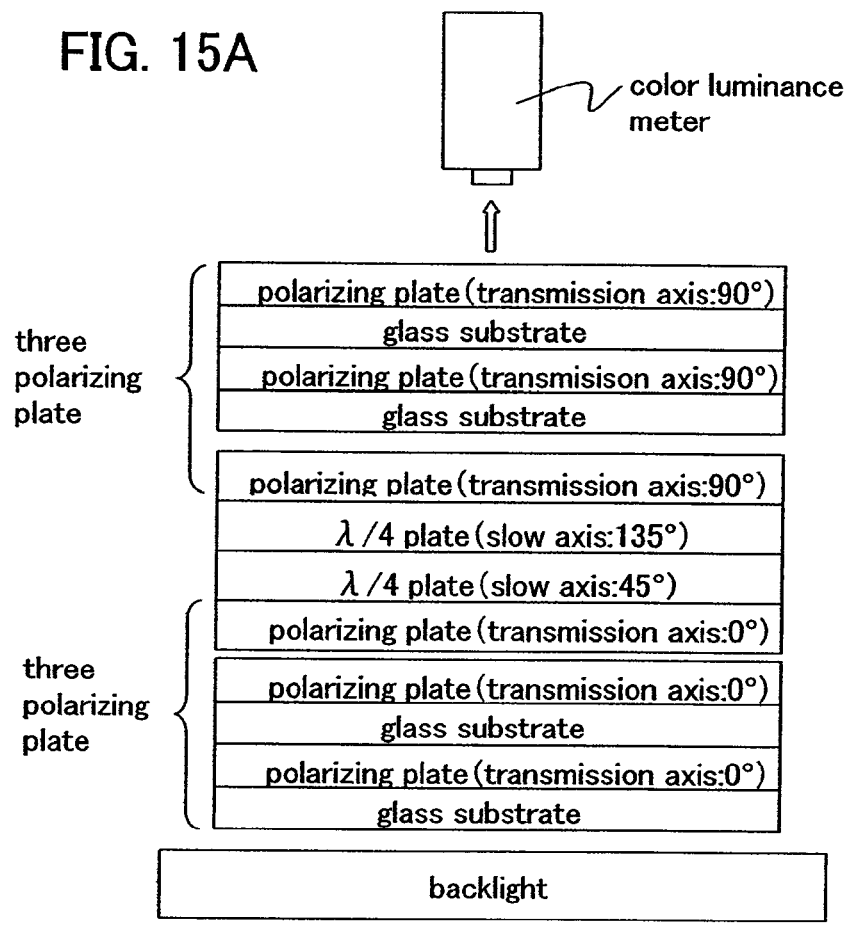
FIGS. 15A and 15B are views each showing a measurement system of Embodiment 2.
Figure 15B:
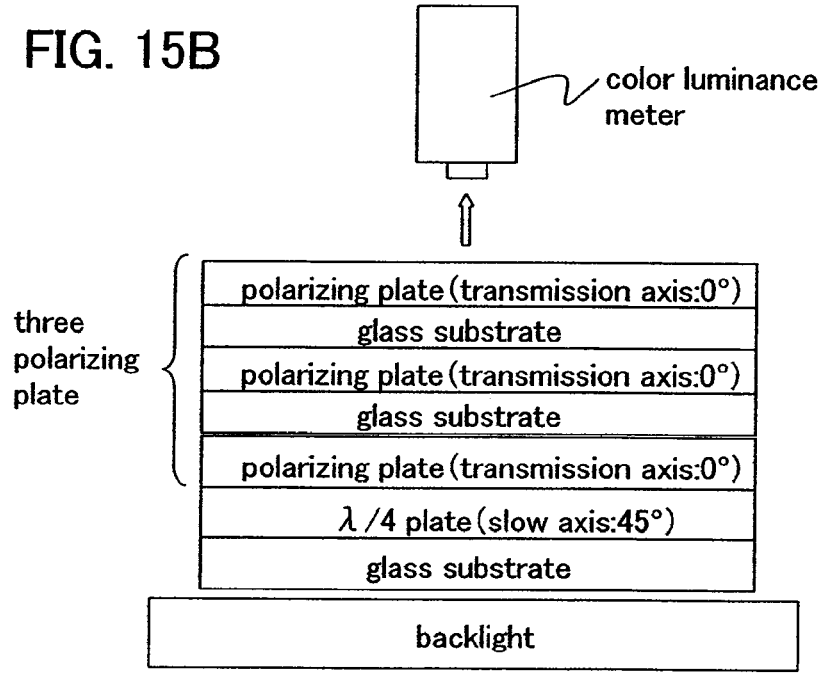

The transmission axes of the opposed polarizing plates were arranged to be in a crossed nicol state, and black luminance and white luminance were measured and a contrast ratio was calculated. FIG. 15A shows an optical system for black luminance measurement, and FIG. 15B shows an optical system for white luminance measurement. Here, an optical system with three polarizing plates on the backlight side and three polarizing plates on the viewing side is shown. A WB-CP-W (manufactured by Sumitomo Chemical Co., Ltd.) was used for the circularly polarizing plate, and a NPF-EG1425DU (manufactured by NITTO DENKO CORPORATION) was used for the stacked polarizing plates. Although the stacked polarizing plates were used by being attached to a glass substrate, since transmittance of a glass substrate is high, it is considered that the presence of the glass substrate does not give influence on the result of this experiment. The experiment was performed in a dark room as follows: luminance when the number of polarizing plates to be stacked was changed was measured by a color luminance meter BM5A, and a contrast ratio was calculated.

Figure 16:
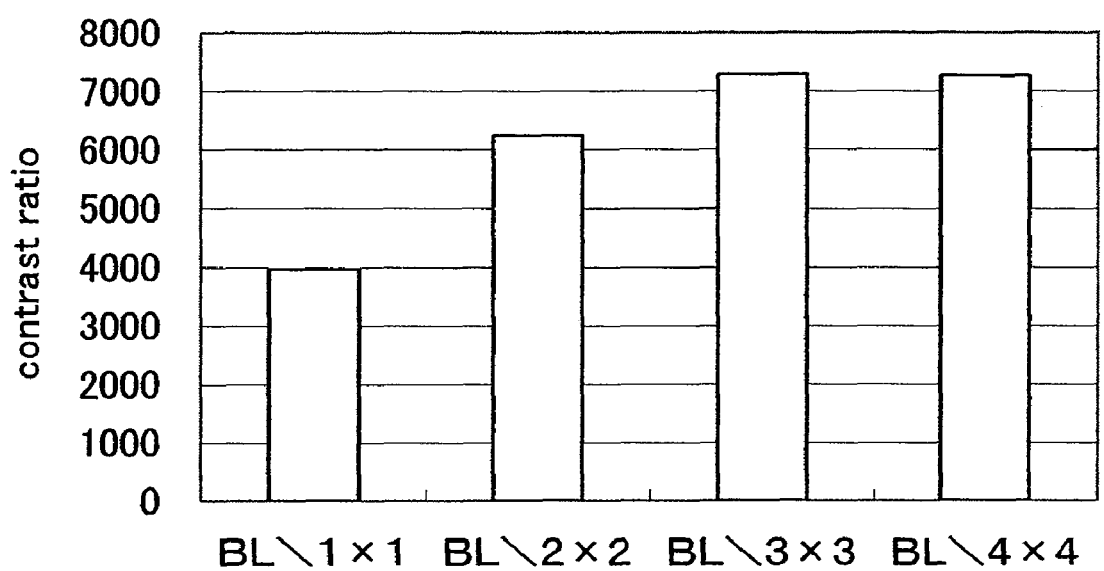
FIG. 16 is a view showing a calculated result of Embodiment 2.

FIG. 16 shows a calculation result of a contrast ratio. It is revealed that a contrast ratio is increased as the polarizing plate is increased one by one on each side. However, almost the same contrast ratio is obtained in "BL\3×3 and "BL\4×4". Therefore, it can be said that a contrast ratio is saturated when three polarizing plates are provided on each side.

Light leakage can be reduced by arranging so that transmission axes of stacked polarizing plates are in a parallel nicol state in this manner. Further, by providing a circularly polarizing plate having opposed polarizing plates arranged to be in a crossed nicol state, light leakage can be reduced in comparison to a circularly polarizing plate in which polarizing plates each having a single layer structure are arranged to be in a crossed nicol state. Accordingly, a contrast ratio of a display device can be increased. It is to be noted that the opposed polarizing plates are preferably arranged to be in a crossed nicol state, whereby a high contrast ratio can be obtained in wideband. The number of polarizing plates to be stacked is preferably three.

This application is based on Japanese Patent Application serial No. 2005-345537 filed in Japan Patent Office on Nov. 30, 2005, the contents of which are hereby incorporated by reference.

EXPLANATION OF REFERENCE

100: layer, 101: light transmitting substrate, 102: light transmitting substrate, 111: polarizing plate (A), 112: polarizing plate (A), 113: retardation film (A), 121: polarizing plate (B), 122: polarizing plate (B), 123: retardation film (B), 201: light transmitting substrate, 202: light transmitting substrate, 203: thin film transistor, 204: thin film transistor, 205: insulating layer, 206: electrode, 207: electroluminescent layer, 208: electrode, 209: light emitting element, 210: insulating layer, 211: polarizing plate (A), 212: polarizing plate (A), 213: retardation film (A), 214: capacitor element, 215: pixel portion, 216: polarizing plate, 217: polarizing plate, 218: driver circuit portion, 220: opposing substrate, 221: polarizing plate (B), 222: polarizing plate (B), 223: retardation film (B), 225: retardation film, 226: polarizing plate, 227: polarizing plate, 228: sealing member, 235: retardation film, 700: pixel portion, 701: shift register, 704: level shifter, 705: buffer, 711: shift register, 712: latch circuit, 713: latch circuit, 714: level shifter, 715: buffer, 722: signal line driver circuit, 723: scanning line driver circuit, 6110: transistor, 6111: transistor, 6112: capacitor element, 6113: light emitting element, 6114: signal line, 6115: power supply line, 6116: scanning line, 6118: transistor, 6119: scanning line, 6125: transistor, 6126: wiring, 9101: main body, 9102: display portion, 9201: main body, 9202: display portion, 9301: main body, 9302: display portion, 9401: main body, 9402: display portion, 9501: main body, 9502: display portion, 9701: display portion, 9702: display portion

The invention claimed is:

1. A display device comprising:
a first light transmitting substrate;
a second light transmitting substrate opposed to the first light transmitting substrate;
a light emitting element provided between the first light transmitting substrate and the second light transmitting substrate;
a first circularly polarizing plate having stacked first linearly polarizing plates arranged on an outer side of the first light transmitting substrate; and
a second circularly polarizing plate having stacked second linearly polarizing plates arranged on an outer side of the second light transmitting substrate,
wherein the light emitting element emits light in both directions of the first light transmitting substrate and the second light transmitting substrate, and
wherein each of the stacked first linearly polarizing plates and each of the stacked second linearly polarizing plates comprises an adhesive surface and a mixed layer of polyvinyl alcohol and iodine.

2. The display device according to claim 1, wherein the light emitting element comprises an electroluminescent element.

3. The display device according to claim 1, further comprising a thin film transistor formed over the first light transmitting substrate.

4. A display device comprising:
a first light transmitting substrate;
a second light transmitting substrate opposed to the first light transmitting substrate;
a light emitting element provided between the first light transmitting substrate and the second light transmitting substrate;
a first circularly polarizing plate having stacked first linearly polarizing plates arranged on an outer side of the first light transmitting substrate; and
a second circularly polarizing plate having stacked second linearly polarizing plates arranged on an outer side of the second light transmitting substrate,
wherein the light emitting element emits light in both directions of the first light transmitting substrate and the second light transmitting substrate,
wherein transmission axes of the stacked first linearly polarizing plates are arranged to be in a parallel nicol state, transmission axes of the stacked second linearly polarizing plates are arranged to be in a parallel nicol state,
wherein the transmission axes of the stacked first linearly polarizing plates and the transmission axes of the stacked second linearly polarizing plates are arranged to be in a parallel nicol state, and
wherein each of the stacked first linearly polarizing plates and each of the stacked second linearly polarizing plates comprises an adhesive surface and a mixed layer of polyvinyl alcohol and iodine.

5. The display device according to claim 4, wherein the light emitting element comprises an electroluminescent element.

6. The display device according to claim 4, further comprising a thin film transistor formed over the first light transmitting substrate.

7. A display device comprising:
a first light transmitting substrate;
a second light transmitting substrate opposed to the first light transmitting substrate;
a light emitting element provided between the first light transmitting substrate and the second light transmitting substrate;
stacked first linearly polarizing plates arranged on an outer side of the first light transmitting substrate;
stacked second linearly polarizing plates arranged on an outer side of the second light transmitting substrate;
a first retardation film provided between the first light transmitting substrate and the stacked first linearly polarizing plates; and
a second retardation film provided between the second light transmitting substrate and the stacked second linearly polarizing plates,
wherein the light emitting element emits light in both directions of the first light transmitting substrate and the second light transmitting substrate,
wherein transmission axes of the stacked first linearly polarizing plates are arranged to be in a parallel nicol state, transmission axes of the stacked second linearly polarizing plates are arranged to be in a parallel nicol state,
wherein the transmission axes of the stacked first linearly polarizing plates and the transmission axes of the stacked second linearly polarizing plates are arranged to be in a parallel nicol state,
wherein a slow axis of the first retardation film is arranged to be at 45° with respect to the transmission axes of the stacked first linearly polarizing plates, and a slow axis of the second retardation film is arranged to be at 45° with respect to the transmission axes of the stacked second linearly polarizing plates, and
wherein each of the stacked first linearly polarizing plates and each of the stacked second linearly polarizing plates comprises an adhesive surface and a mixed layer of polyvinyl alcohol and iodine.

8. The display device according to claim 7, wherein the light emitting element comprises an electroluminescent element.

9. The display device according to claim 7, further comprising a thin film transistor formed over the first light transmitting substrate.

10. A display device comprising:
a first light transmitting substrate;
a second light transmitting substrate opposed to the first light transmitting substrate;
a light emitting element provided between the first light transmitting substrate and the second light transmitting substrate;
stacked first linearly polarizing plates arranged on an outer side of the first light transmitting substrate;
a second linearly polarizing plate arranged on an outer side of the second light transmitting substrate;
a first retardation film provided between the first light transmitting substrate and the stacked first linearly polarizing plates; and
a second retardation film provided between the second light transmitting substrate and the second linearly polarizing plate,
wherein the light emitting element emits light in both directions of the first light transmitting substrate and the second light transmitting substrate,
wherein transmission axes of the stacked first linearly polarizing plates are arranged to be in a parallel nicol state,
wherein the transmission axes of the stacked first linearly polarizing plates and a transmission axis of the second linearly polarizing plate are arranged to be in a parallel nicol state,
wherein a slow axis of the first retardation film is arranged to be at 45° with respect to the transmission axis of the stacked first linearly polarizing plates, and a slow axis of the second retardation film is arranged to be at 45° with respect to the transmission axis of the second linearly polarizing plate, and
wherein each of the stacked first linearly polarizing plates and the stacked second linearly polarizing plate comprises an adhesive surface and a mixed layer of polyvinyl alcohol and iodine.

11. The display device according to claim 10, wherein the light emitting element comprises an electroluminescent element.

12. The display device according to claim 10, further comprising a thin film transistor formed over the first light transmitting substrate.

13. A display device comprising:
a first light transmitting substrate;
a second light transmitting substrate opposed to the first light transmitting substrate;
a light emitting element provided between the first light transmitting substrate and the second light transmitting substrate;
a first circularly polarizing plate having stacked first linearly polarizing plates arranged on an outer side of the first light transmitting substrate; and
a second circularly polarizing plate having stacked second linearly polarizing plates arranged on an outer side of the second light transmitting substrate,
wherein the light emitting element emits light in both directions of the first light transmitting substrate and the second light transmitting substrate,
wherein transmission axes of the stacked first linearly polarizing plates are arranged to be in a parallel nicol state, transmission axes of the stacked second linearly polarizing plates are arranged to be in a parallel nicol state,
wherein the transmission axes of the stacked first linearly polarizing plates and the transmission axes of the stacked second linearly polarizing plates are arranged to be in a crossed nicol state, and
wherein each of the stacked first linearly polarizing plates and each of the stacked second linearly polarizing plates comprises an adhesive surface and a mixed layer of polyvinyl alcohol and iodine.

14. The display device according to claim 13, wherein the light emitting element comprises an electroluminescent element.

15. The display device according to claim 13, further comprising a thin film transistor formed over the first light transmitting substrate.

16. A display device comprising:
a first light transmitting substrate;
a second light transmitting substrate;
a light emitting element provided between the first light transmitting substrate and the second light transmitting substrate;
stacked first linearly polarizing plates arranged on an outer side of the first light transmitting substrate;
stacked second linearly polarizing plates arranged on an outer side of the second light transmitting substrate;
a first retardation film provided between the first light transmitting substrate and the stacked first linearly polarizing plates; and
a second retardation film provided between the second light transmitting substrate and the stacked second linearly polarizing plates,
wherein the light emitting element emits light in both directions of the first light transmitting substrate and the second light transmitting substrate,
wherein transmission axes of the stacked first linearly polarizing plates are arranged to be in a parallel nicol state, transmission axes of the stacked second linearly polarizing plates are arranged to be in a parallel nicol state,
wherein the transmission axes of the stacked first linearly polarizing plates and the transmission axes of the stacked second linearly polarizing plates are arranged to be in a crossed nicol state,
wherein a slow axis of the first retardation film is arranged to be at 45° with respect to the transmission axes of the stacked first linearly polarizing plates, and a slow axis of the second retardation film is arranged to be at 45° with respect to the transmission axes of the stacked second linearly polarizing plates, and
wherein each of the stacked first linearly polarizing plates and each of the stacked second linearly polarizing plates comprises an adhesive surface and a mixed layer of polyvinyl alcohol and iodine.

17. The display device according to claim 16, wherein the light emitting element comprises an electroluminescent element.

18. The display device according to claim 16, further comprising a thin film transistor formed over the first light transmitting substrate.

19. A display device comprising:
a first light transmitting substrate;
a second light transmitting substrate opposed to the first light transmitting substrate;

a light emitting element provided between the first light transmitting substrate and the second light transmitting substrate;

stacked first linearly polarizing plates arranged on an outer side of the first light transmitting substrate;

a second linearly polarizing plate arranged on an outer side of the second light transmitting substrate;

a first retardation film provided between the first light transmitting substrate and the stacked first linearly polarizing plates; and a second retardation film provided between the second light transmitting substrate and the second linearly polarizing plate, wherein the light emitting element emits light in both directions of the first light transmitting substrate and the second light transmitting substrate, wherein transmission axes of the stacked first linearly polarizing plates are arranged to be in a parallel nicol state, the transmission axes of the stacked first linearly polarizing plates and a transmission axis of the second linearly polarizing plate are arranged to be in a crossed nicol state, wherein a slow axis of the first retardation film is arranged to be at 45° with respect to the transmission axis of the stacked first linearly polarizing plates, and a slow axis of the second retardation film is arranged to be at 45° with respect to the transmission axis of the second linearly polarizing plate, and wherein each of the stacked first linearly polarizing plates and the second linearly polarizing plate comprises an adhesive surface and a mixed layer of polyvinyl alcohol and iodine.

20. The display device according to claim 19, wherein the light emitting element comprises an electroluminescent element.

21. The display device according to claim 19, further comprising a thin film transistor formed over the first light transmitting substrate.

* * * * *